US005798991A

United States Patent [19]
Haneda

[11] Patent Number: 5,798,991
[45] Date of Patent: Aug. 25, 1998

[54] DATA PROCESSING METHOD AND DATA PROCESSING APPARATUS

[75] Inventor: Naoya Haneda, Kanagawa, Japan

[73] Assignee: Sony Corporation, Tokyo, Japan

[21] Appl. No.: 932,477

[22] Filed: Sep. 18, 1997

Related U.S. Application Data

[62] Division of Ser. No. 614,338, Mar. 12, 1996.

[30] Foreign Application Priority Data

Mar. 15, 1995 [JP] Japan ................................. 7-056108

[51] Int. Cl.$^6$ ................................................ G11B 7/00
[52] U.S. Cl. .................. 369/47; 369/48; 369/54; 369/58; 369/60
[58] Field of Search ................. 369/58, 54, 48, 369/59, 47, 60, 32, 49

[56] References Cited

U.S. PATENT DOCUMENTS

| | | | |
|---|---|---|---|
| 4,835,757 | 5/1989 | Abiko | 369/54 |
| 4,868,806 | 9/1989 | Sakagami | 369/58 |
| 5,107,481 | 4/1992 | Miki et al. | 369/59 |
| 5,210,734 | 5/1993 | Sakurai | 369/49 |
| 5,288,982 | 2/1994 | Hosoya | 235/454 |
| 5,410,526 | 4/1995 | Maeda et al. | 369/47 |
| 5,442,614 | 8/1995 | Tamegai | 369/59 |
| 5,481,519 | 1/1996 | Hosoya | 369/59 |
| 5,499,224 | 3/1996 | Sanada | 369/48 |
| 5,528,569 | 6/1996 | Fujiie et al. | 369/48 |
| 5,566,379 | 10/1996 | Mawatori et al. | 369/48 |
| 5,587,978 | 12/1996 | Endo et al. | 369/49 |
| 5,659,528 | 8/1997 | Kojima et al. | 369/60 |
| 5,687,150 | 11/1997 | Nomaka et al. | 369/47 |

FOREIGN PATENT DOCUMENTS 06-309861  11/1994  Japan .

*Primary Examiner*—Thang V. Tran
*Attorney, Agent, or Firm*—Limbach & Limbach L.L.P.

[57] ABSTRACT

A method for processing data is provided to permit finer management and editing of data irrespective of the data structure and the components or nature of the data when managing the recording or reproduction of a variety of data and performing division, connection, deletion, and other editing. The method comprises a first recording and reproduction step of recording and reproducing the data in predetermined units, a processing step of processing the data in predetermined units, a first management data generation step of generating first management data for managing the recording and reproduction of data at the first recording and reproduction step in predetermined units, a second recording and reproduction step of recording and reproducing the data in units smaller than the predetermined units, a second management data generation step of generating the second management data for managing the recording and reproduction of data at the second recording and reproduction step in units smaller than the predetermined units, and a control step of controlling the recording and reproduction at the first recording and reproduction step and the recording and reproduction at second recording and reproduction step based on said first and second management data.

12 Claims, 24 Drawing Sheets

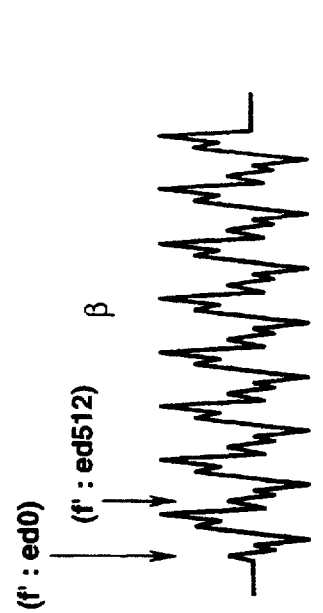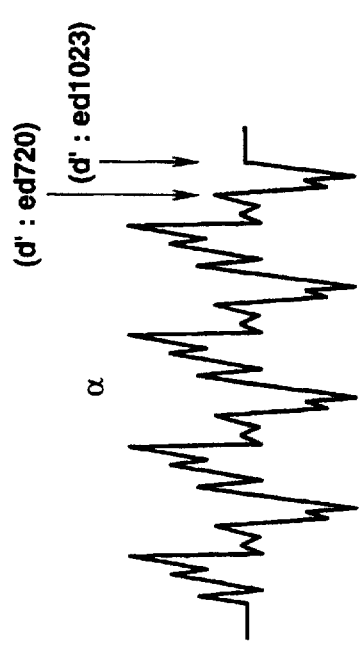
FIG. 1A (PRIOR ART)
FIG. 1B (PRIOR ART)
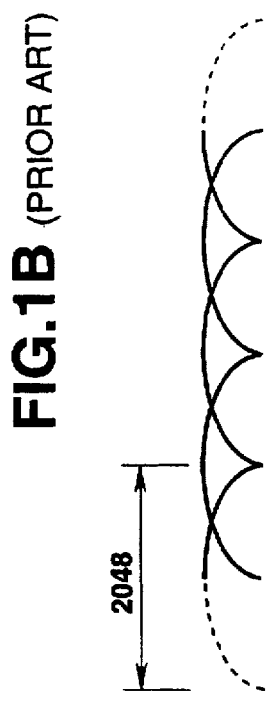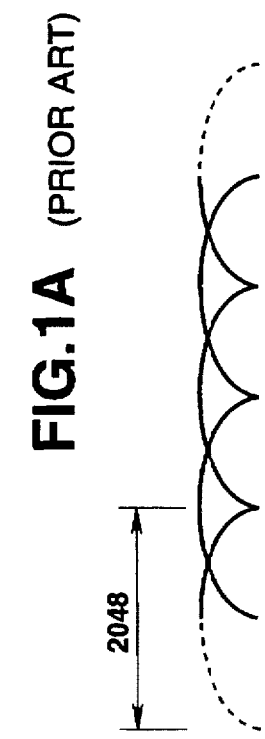
FIG. 1C (PRIOR ART)
FIG. 1D (PRIOR ART)
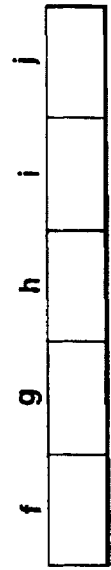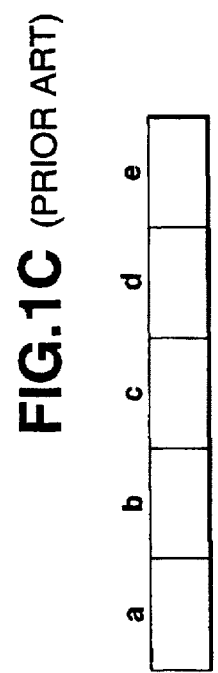
FIG. 1E (PRIOR ART)
FIG. 1F (PRIOR ART)

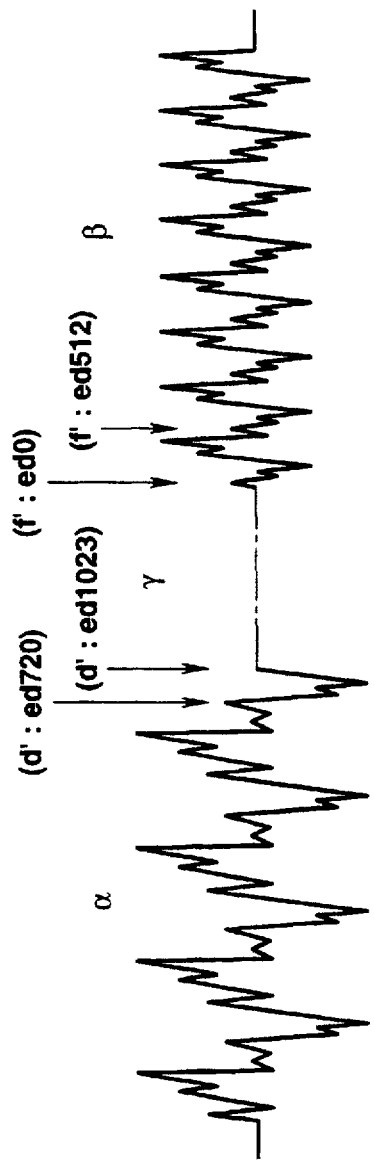
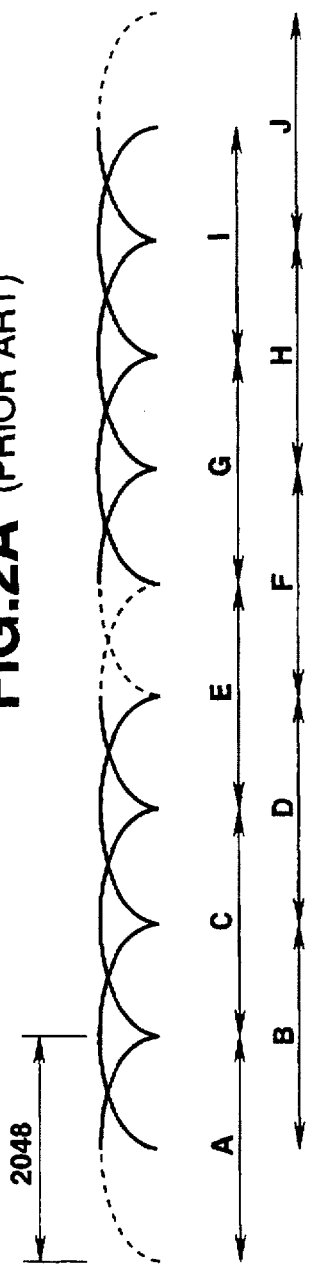
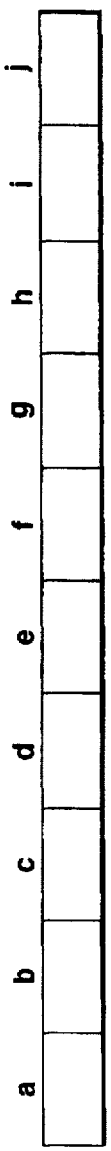
FIG.2A (PRIOR ART)
FIG.2B (PRIOR ART)
FIG.2C (PRIOR ART)

|    | RECORDING DATA MANAGEMENT DATA |      |
|------|------|------|
| p1   | m1   |      |
| p2   | m2   |      |
| p3   | m0   |      |
| p4   | m3   |      |
| p5   | m4   | (−1) |
| ⋮    | ⋮    | ⋮    |
| p256 | m255 | (−1) |

FIG.4

RECORDING POSITION DATA

| | | |
|---|---|---|
| m0 | e0 | |
| | n0 | (−1) |
| | e0 | |
| m1 | s1 | |
| | n1 | |
| | e1 | |
| m2 | s2 | |
| | n2 | |
| | e2 | |
| m3 | s3 | |
| | n3 | |
| | e3 | |
| ⋮ | ⋮ | |
| m255 | s255 | |
| | n255 | |
| | e255 | |

FIG.5

| | REPRODUCTION POSITION DATA |
|---|---|
| n2 | s2 : pb300 |
| | e2 : pb99 |
| | −1 |
| n1 | s1 : pb0 |
| n1+1 | s1 : pb200 |
| | e1 : pb299 |
| | −1 |
| n3 | s3 : pb100 |
| n3+1 | s3 : pb300 |
| n3+2 | s3+1 : pb400 |
| n3+3 | s3+2 : pb0 |
| n3+4 | s3+3 : pb0 |
| n3+5 | s3 : pb100 |
| | e3 : pb511 |
| | −1 |
| | ⋮ |
| | −1 |

FIG.6

| | RECORDING DATA MANAGEMENT DATA | |
|---|---|---|
| p1 | n1 | |
| p2 | n2 | |
| p3 | n0 | |
| p4 | n3 | |
| p5 | n4 | (−1) |
| ⋮ | ⋮ | ⋮ |
| p256 | n255 | (−1) |

FIG.10

| | RECORDING DATA MANAGEMENT DATA | |
|---|---|---|
| p1 | m1 | |
| p2 | m2 | |
| p3 | m0 | |
| p4 | m3 | |
| p5 | m4 | (−1) |
| ⋮ | ⋮ | ⋮ |
| p256 | m255 | (−1) |

FIG.15

| | REPRODUCTION POSITION DATA |
|---|---|
| n2 | s2 : pb300 |
| | e2 : pb99 |
| | −1 |
| n1 | s1 : pb0 |
| n1+1 | s1 : pb200 |
| | e1 : pb299 |
| | −1 |
| n3 | s3 : pb100 |
| n3+1 | s3 : pb300 |
| n3+2 | s3+1 : pb400 |
| n3+3 | s3+2 : pb0 |
| n3+4 | s3+3 : pb0 |
| n3+5 | s3 : pb100 |
| | e3 : pb511 |
| n0 | s0 : pb0 |
| | e0 : pb511 |
| | −1 |
| | ⋮ |
| | −1 |

FIG.11

| | RECORDING POSITION DATA | |
|---|---|---|
| m0 | e0 | |
| | n0 | (−1) |
| | e0 | |
| m1 | s1 | |
| | n1 | |
| | e1 | |
| m2 | s2 | |
| | n2 | |
| | e2 | |
| m3 | s3 | |
| | n3 | |
| | e3 | |
| m4 | s4 | |
| ⋮ | ⋮ | |
| m255 | s255 | |
| | n255 | |
| | e255 | |

FIG.16

| | EDITING POSITION DATA |
|---|---|
| n2 | s2 : ed200 |
| n2+1 | s2 : ed600 |
| | −1 |
| n1 | s1+3 : ed720 |
| n1+1 | s1+5 : ed512 |
| | −1 |
| n3 | s3 : ed1023 |
| n3+1 | s3+2 : ed0 |
| n3+2 | s3+3 : ed600 |
| n3+3 | s3+4 : ed200 |
| | −1 |
| | ⋮ |
| | −1 |

FIG.17

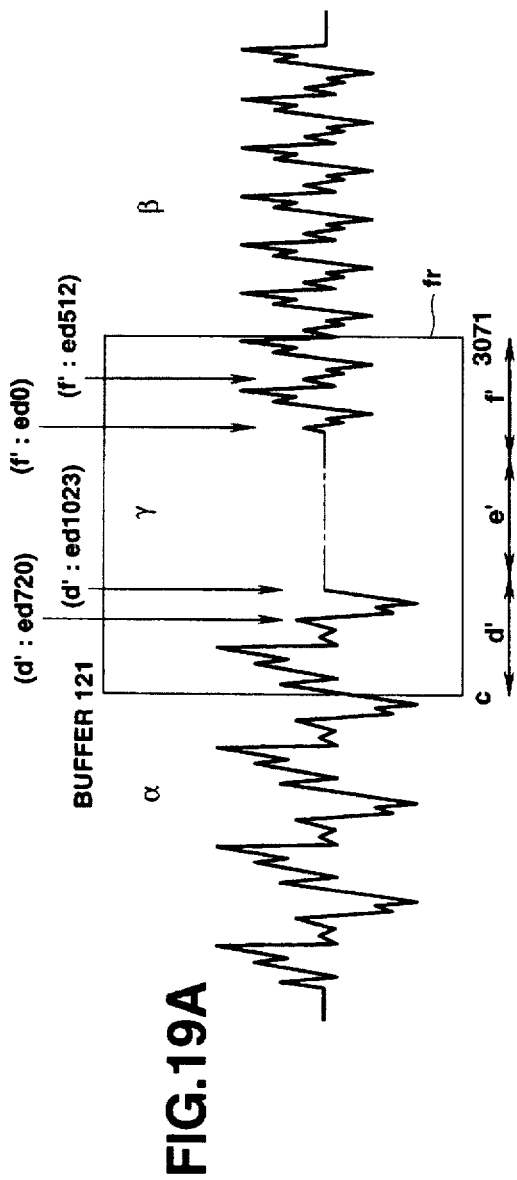
FIG.19A
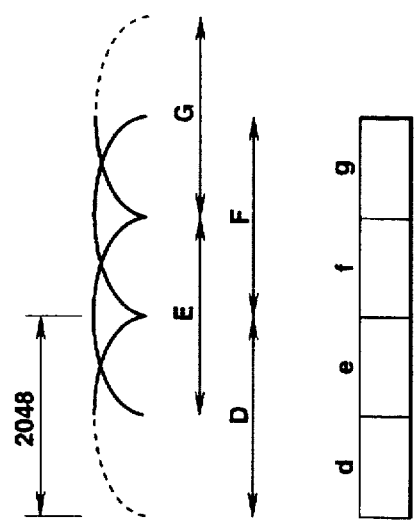
FIG.19B
FIG.19C

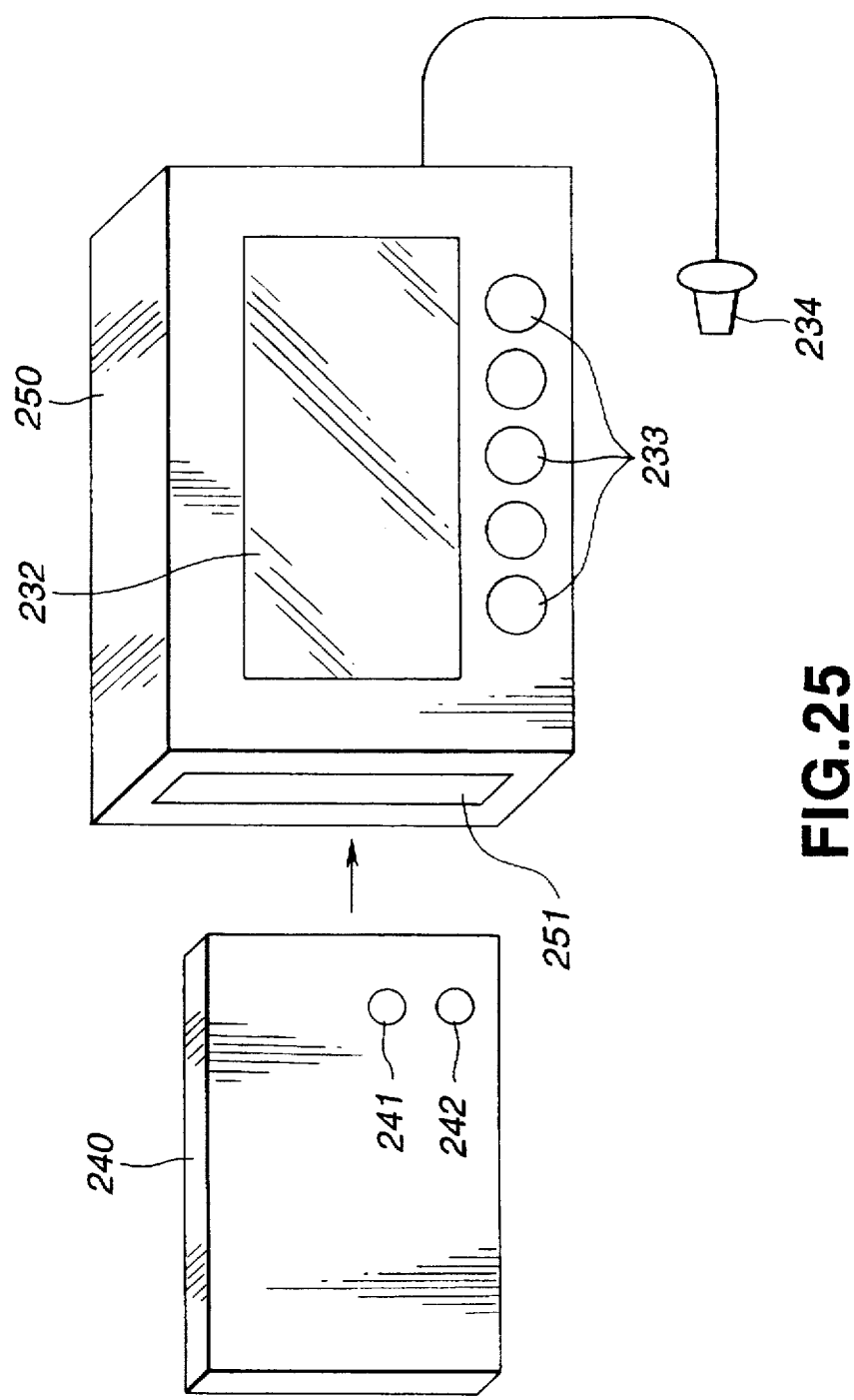

DATA PROCESSING METHOD AND DATA PROCESSING APPARATUS

This is a divisional of application Ser. No. 08/614,338, filed Mar. 12, 1996.

BACKGROUND OF THE INVENTION

1. Field of the Invention

The present invention relates to a data processing method and apparatus suitable for use when managing and editing data recorded on a recording medium.

2. Description of the Related Art

Conventionally, a data recording apparatus for recording music, news, and other data (hereinafter these data are referred to as "original data") on a recording medium records management data for managing the original data on the recording medium simultaneously with the original data so as to enable management of the data after this. On the other hand, a data reproducing apparatus for reproducing the original data from the recording medium on which the original data and the management data thereof are recorded reproduces the original data based on the management data recorded on the recording medium. Namely, recording data indicating the recording positions of the original data as the management data together with the original data on the recording medium enables the management data to be referred to at the time of the reproduction and, accordingly, random access of a disk or other recording medium based on the management data. The original data, further, is comprised of data of predetermined sizes referred to for example as "sectors" for convenience of data management and is managed using these as minimum units. For this reason, the random access is carried out in these minimum units.

One example of a conventional data recording apparatus and data reproducing apparatus is the Mini Disc (trademark of Sony Corporation, hereinafter referred to as an "MD") recorder and player. In this device, audio data is managed in minimum units, called "sound groups", of 424 bytes or several milliseconds when converted to reproduction time. Up to 256 series of management data can be recorded as "user table of content" (UTOC) data in a UTOC area of the disc. Note that, where the audio data is musical sound data and stereo, the sound group is obtained by putting together the sound frames of the two left and right channels, and the management data is for management of the recording positions on the disc of the sound groups corresponding to the lead positions of the different pieces of music. Accordingly, at the time of reproduction from the disc, it becomes possible to perform random access etc. based on the UTOC data. Further, in the case of a disc used only for reading, it becomes possible to perform random access based on the "table of contents" (TOC) recorded in the lead-in area of the disc.

Where original data such as music or news is recorded on the recording medium or reproduced from the recording medium by using the data recording and reproducing apparatus as mentioned above, it is preferable to make it possible for the user of the apparatus to designate any recording position he or she desires. If the user can designate any desired recording position, random access to any recording position becomes possible. Similarly, if the user of the apparatus can designate any desired recording position, finer editing such as division, connection, and deletion of data would become possible.

In an MD recorder and player, however, the data is managed in minimum units of sound groups as mentioned above, so random access is always carried out with respect to the lead positions of the sound groups. Further, even when editing the original data, the editing of the original data is always performed at positions serving as the boundaries between the sound groups.

In this way, management data such as the TOC data or UTOC data are structured in a manner making it impossible to perform random access or to perform the division, connection, deletion, and other editing designating any recording position within a sound group.

On the other hand, when the MD recorder and player records music, news, or other original data recorded on the disc, it performs orthogonal transformation or other coding processing on a predetermined number of the time series data, so this recorded data becomes data mainly based on the frequency component. Accordingly, even if it were possible to designate any recording position within a sound group, it would be impossible to reproduce the actual audio data from the recording position designated for the random access and, similarly, it would be impossible to edit actual musical sound data using any recording position.

Particularly, when editing data, even if editing at the boundaries of the sound groups, there will be portions which cannot be guaranteed in the reproduced data, which becomes a problem.

FIGS. 1A, 1B, 1C, 1D, 1E, and 1F show in a simplified manner the state of a modified discrete cosine transform (MDCT) which is a type of orthogonal transformation, and an inverse MDCT (IMDCT), which is an inverse transformation of this. FIG. 1A and FIG. 1B show two musical sound waveform signals $\alpha$ and $\beta$, which are time series data, respectively; FIG. 1C and FIG. 1D show transform windows A to E and F to J at the time of orthogonal transformation with respect to the two musical sound waveform signals $\alpha$ and $\beta$; and FIG. 1E and FIG. 1F show frames a to e and f to j of encoded data obtained by orthogonally transforming the two musical sound waveform signals $\alpha$ and $\beta$ and coding the same. Note that, the data is managed in minimum units of frames.

In FIGS. 1A, 1B, 1C, 1D, 1E, and 1F, the explanation will be made taking as an example the musical sound waveform signal a and the transform window D. By performing the orthogonal transformation with respect to 2048 sample values of the musical sound waveform signal a using the transform window D, encoded data of the frame d can be obtained. On the other hand, by performing inverse transformation with respect to for example the encoded signals of frames c and d using the transform windows C and D, respectively, 1024 decoded signals of a latter half portion of the transform window C (first half portion of the transform window D) can be obtained. Further, similarly, by performing inverse transformation with respect to the encoded data of the frames d and e by using the transform windows D and E, respectively, 1024 decoded signals of the latter half portion of the transform window D (first half portion of the transform window E) can be obtained. 2048 sample values corresponding to the transform window D can be restored from the 1024 decoded signals of the latter half portion of the transform window C (first half portion of the transform window D) and 1024 decoded signals of the latter half portion of the transform window D (first half portion of the transform window E). By similarly performing the orthogonal transformation also for the other portion of the musical sound waveform signal $\alpha$ and the musical sound waveform signal $\beta$, the encoded data can be obtained and the sample values can be restored by similarly performing the inverse transformation as above. Of course, the transform windows in the MDCT and IMDCT differ from actual transform windows, but they are assumed to be the same so as to simplify the explanation.

FIGS. 2A, 2B, and 2C show an example where the final frame e of the musical sound waveform signal a and the head frame f of the musical sound waveform signal β in FIGS. 1A to 1F are simply connected by editing. FIG. 2A shows the musical sound waveform signals α and β when they are simply connected. FIG. 2B shows the transform windows A to J. FIG. 2C shows the frames a to j. Here, by performing the inverse transformation as mentioned above, decoding can be accurately carried out up to the latter half portion of the transform window D and similarly the latter half portion of the transform window F and subsequent portions can be accurately decoded. However, it becomes impossible to predict the 1024 decoded signals of the latter half portion of the transform window E (first half portion of the transform window F) obtained by performing the inverse transformation for the frames e and f which are the portions connected by editing using the transform windows E and F, respectively. Namely, in the figure, the dot-chain line portion γ of the waveform signal of FIG. 2B corresponding to the connection portion of the musical sound waveform signals α and β is no longer guaranteed in value, so there is a problem if the frames are simply connected in editing.

As mentioned above, in a conventional data recording and reproducing apparatus, where desiring to manage and edit the data at any recording position, that is, where desiring to manage or edit the data in units smaller than the minimum unit for managing the data, the data structure and components and the nature of the data to be recorded become problems. Accordingly, sometimes it is not possible perform finer random access, edit data in a finer manner, etc.

OBJECT AND SUMMARY OF THE INVENTION

The present invention was made in consideration of the above actual circumstances and has as an object thereof to provide a data processing method and apparatus with which the finer management and editing of data can be carried out irrespective of the data structure and the components or nature of the data when managing the recording or reproduction of a variety of data and performing division, connection, deletion, and other editing.

The data processing method of the present invention has been proposed so as to achieve the above object and comprises a first recording and reproduction step of recording and reproducing data in predetermined units; a processing step of processing the data in predetermined units; a first management data generation step of generating first management data for managing the recording and reproduction of data at the first recording and reproduction step in predetermined units; a second recording and reproduction step of recording and reproducing the data in smaller units than the predetermined units; a second management data generation step of generating second management data for managing the recording and reproduction of the data at the second recording and reproduction step in smaller units than the predetermined units; and a control step of controlling the recording and reproduction at the first recording and reproduction step and the recording and reproduction at the second recording and reproduction step based on the first and second management data.

Further, so as to achieve the object of the present invention, in the data processing method of the present invention, the first management data is data indicating the position of the recording and reproduction at the first recording and reproduction step, and the second management data is data indicating the position of the recording and reproduction at the second recording and reproduction step.

Further, so as to achieve the object of the present invention, in the data processing method of the present invention, the first management data is data indicating the position of the recording and reproduction at the first recording and reproduction step, and the second management data is data indicating the position at which the editing should be carried out.

The data processing apparatus of the present invention is constituted by a first recording and reproducing means for recording and reproducing the data with respect to the recording medium in predetermined units; a processing means for processing the data in predetermined units; a first management data generating means for generating first management data for managing the recording and reproduction of the data with respect to the recording medium by the first recording and reproducing means in predetermined units; a second recording and reproduction means for recording and reproducing data with respect to the recording medium in smaller units than the predetermined units; a second management data generating means for generating second management data for managing the recording and reproduction of the data with respect to the recording medium by the second recording and reproducing means in units smaller than the predetermined units; and a control means for controlling the recording and reproduction at the first recording and reproducing means and the recording and reproduction at the second recording and reproducing means based on the first and second management data.

Further, so as to achieve the object of the present invention, in the data processing apparatus of the present invention, the first management data is data indicating the position of the recording and reproduction by the first recording and reproducing means; and the second management data is data indicating the position of the recording and reproduction at the second recording and reproducing means.

Further, so as to achieve the object of the present invention, in the data processing apparatus of the present invention, the first management data is data indicating the position of the recording and reproduction by the first recording and reproducing means; and the second management data is data indicating the position at which the editing should be carried out.

Accordingly, when handling data to be processed in predetermined units, according to the present invention, data which must be handled in predetermined units is managed in those predetermined units and data which does not have to be handled in predetermined units can be managed in units smaller than the predetermined units.

BRIEF DESCRIPTION OF THE DRAWINGS

FIGS. 1A, 1B, 1C, 1D, 1E, and 1F are views for explaining the coding and decoding method in a data editing apparatus according to the present invention.

FIGS. 2A, 2B, and 2C are views for explaining the problems in a data editing apparatus according to the present invention.

FIG. 4 is a view (memory map) for explaining the method of managing recording data in the recording data management unit of the data recording and reproducing apparatus of the first embodiment.

FIG. 5 is a view (memory map) for explaining the method of managing recording positions in the recording position management unit of the data recording and reproducing apparatus of the first embodiment.

FIG. 6 is a view (memory map) for explaining a method of the managing the reproduction positions in a reproduction position management unit of the data recording and reproducing apparatus of the first embodiment.

FIG. 10 is a view (memory map) for explaining the method of managing recording data in the recording data management unit of the data recording and reproducing apparatus of another concrete example of the first embodiment.

FIG. 11 is a view (memory map) for explaining the method of managing reproduction positions in the reproduction position management unit of the data recording and reproducing apparatus of another concrete example of the first embodiment.

FIG. 15 is a view (memory map) for explaining the method of managing recording data in the recording data management unit of the data editing apparatus of the second embodiment.

FIG. 16 is a view (memory map) for explaining the method of managing recording positions in the recording position management unit of the data editing apparatus of the second embodiment.

FIG. 17 is a view (memory map) for explaining the method of managing editing positions in the editing position management unit of the data editing apparatus of the second embodiment.

FIGS. 19A, 19B and 19C are views for explaining the method of editing processing in a buffer memory of the data editing apparatus of the second embodiment.

FIG. 25 is a view of outer appearance of the data recording apparatus and data reproducing apparatus of the second embodiment.

DETAILED DESCRIPTION OF PREFERRED EMBODIMENTS

Figure 3:
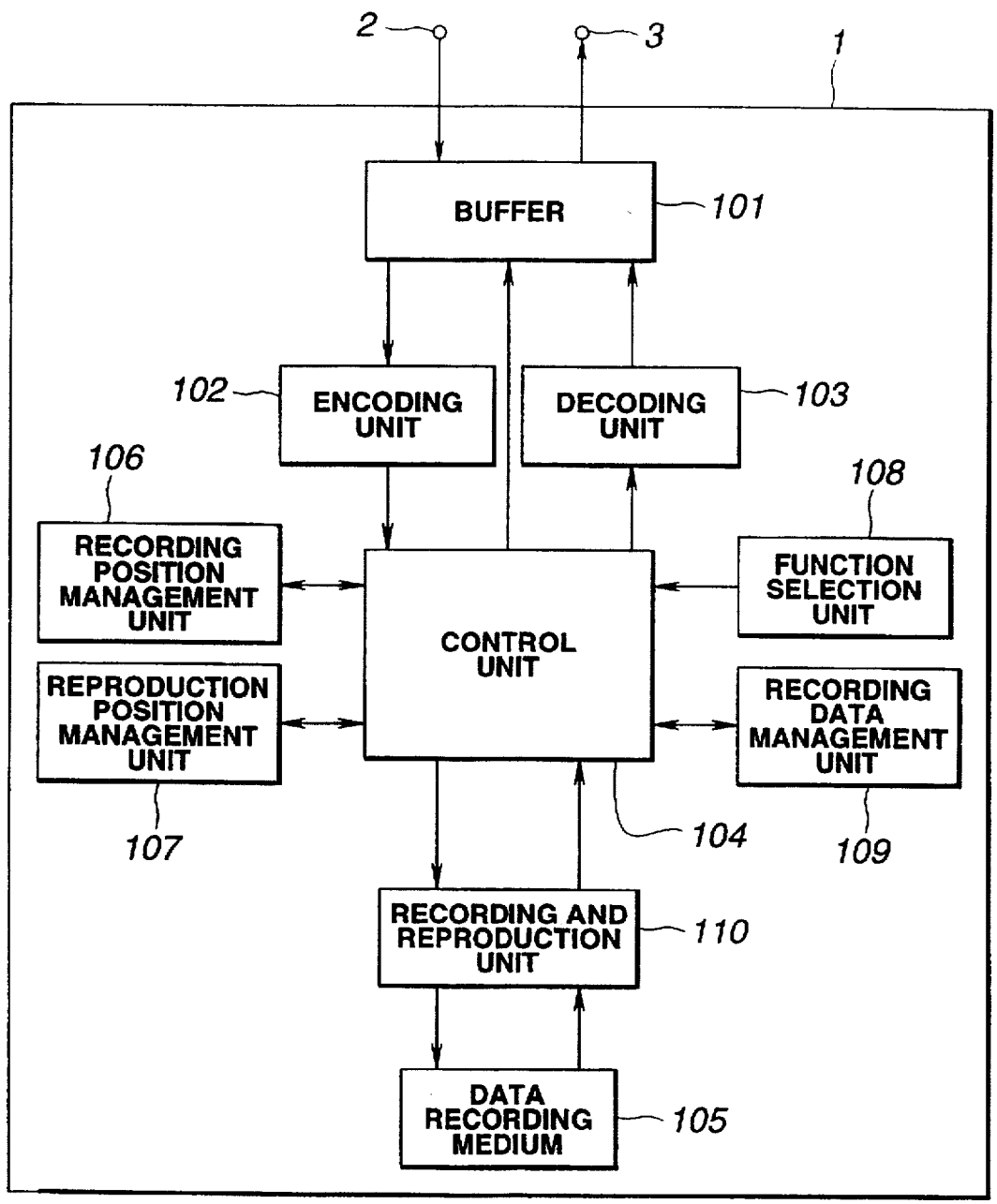
FIG. 3 is a block circuit diagram showing the schematic configuration of a data recording and reproducing apparatus of a first embodiment of the present invention.

Below, an explanation will be made of preferred embodiments of the present invention by referring to the drawings.

First, a detailed explanation will be made of the data recording and reproducing apparatus of the general configuration shown in FIG. 3 as first embodiment of a data processing apparatus to which the data processing method of the present invention is applied.

The data recording and reproducing apparatus 1 shown in FIG. 3 comprises a coding unit 102 for coding input data; a data recording medium 105 for recording the coded data, that is, the data coded in the coding unit 102; a recording position management unit 106 which manages the recording position data indicating the position at which the coded data is recorded in at least the data recording medium 105; a decoding unit 103 for decoding the coded data read from the data recording medium 105; a buffer memory 101 for holding the input data, that is, the data received from the outside of the apparatus and the decoded data, that is, the data decoded in the decoding unit 103; a reproduction position management unit 107 for managing the reproduction position data indicating the position at which the input data is held in at least the buffer memory 101 and the position at which the decoded data is held; a function selection means 108 for selecting the processing to be executed, selecting the data held in the buffer memory 101, and selecting the recording data recorded in the data recording medium 105; a recording data management unit 109 for managing the correspondence between the selected data, that is, the data selected in the function selection means 108, and the recording position data and/or reproduction position data; a recording reproduction unit 110 for recording the coded data in the data recording medium 105 or reproducing the coded data from the data recording medium 105; and a control unit 104 for controlling the respective portions. The control means 104 controls the reception of the input data from the outside of the apparatus to the buffer memory 101, the writing of the coded data to the data recording medium 105, the recording or reproduction of the management data including the recording position data managed by the recording position management unit 106 to or from the data recording medium 105, the recording or reproduction of the management data including the reproduction position data managed by the reproduction position management unit 107 to or from the data recording medium 105, the detection of the recording position data and/or reproduction position data corresponding to the selected data selected in the function selection means 108, the reading of the recording data from the data recording medium 105 based on the detected recording position data, and the reading of the decoded data from the buffer memory 101 and the transmission of the same to the outside of the apparatus based on the detected reproduction position data.

Namely, explaining the data processing method of the present invention by applying the same to the data recording and reproducing apparatus 1 of the present embodiment, the first recording and reproduction step of recording and reproducing the data in predetermined units corresponds to the recording and reproduction of the coded data to or from the data recording medium 105 by the control unit 104 or the recording and reproduction (writing/reading) of the input data to or from the buffer memory 101. Further, the processing step of processing the data in predetermined units corresponds to the coding of the input data from the buffer memory 101 by the coding unit 102 or the decoding of the data read from the data recording medium 105 by the decoding unit 103. The first management data generation step of generating the first management data for managing the recording and reproduction of the data at the first recording and reproduction step in predetermined units corresponds to the generation of the recording position data by the recording position management unit 106. Further, the second recording and reproduction step with which the data can be recorded and reproduced in units smaller than the predetermined units corresponds to the processing for outputting the input data held in the buffer memory 101 to the coding unit 102 or the processing for outputting the decoded data from the decoding unit 103 held in the buffer memory 101 to the output terminal 3. Further, the second management data generation step of generating the second management data for managing the recording and reproduction of the data at the second recording and reproduction step in units smaller than the predetermined units corresponds to the generation of the reproduction position data by the reproduction position management unit 107. Further, the control step of controlling the recording and reproduction at the first recording and reproduction step based on the first and second management data and the recording and reproduction at the second recording and reproduction step corresponds to the control at the control unit 104.

In the data recording and reproducing apparatus 1 shown in FIG. 3, when the function selection means 108 selects the recording function or reproduction function as the processing to be executed, the control unit 104 operates as follows in accordance with the selected recording function or reproduction function.

First, when the recording function is selected by the function selection means 108 as the processing to be executed the data of the predetermined amount required in the coding unit 102 mentioned later is input from the input terminal 2 and temporarily held in the buffer memory 101. Note that, the data input from the input terminal 2 is data such as music, news, etc., that is, data including voice data, music data, character data, image data, etc. Hereinafter, these data will be referred to as the original data. Further, below, one block of the original data input to the input terminal 2 comprised of a predetermined amount of data and processed in the coding unit 102 at one time is referred to as an "input data block". Note that, where the original data is input in real time from the input terminal 2, even when processing the original data in input data blocks at the coding unit 102, preferably the storage capacity of the buffer memory 101 is set larger than the size of the input data blocks so that the original data to be newly input via the input terminal 2 can be held. Further, it becomes possible for the buffer memory 101 to use its capacity with a good efficiency by adopting a ring buffer structure. Further, the data holding function of the buffer memory 101 can be replaced by using a part of recording region of the data recording medium 105 mentioned later. If the data holding function of the buffer memory 101 is replaced by a part of the recording region of the data recording medium 105, it is also possible to omit the buffer memory 101. When the buffer memory 101 is omitted, it becomes possible to simplify the data recording and reproducing apparatus 1. Namely, the recording medium referred to in the data processing apparatus of the present invention includes both of the data recording medium 105 and the buffer memory 101.

Next, when exactly the amount of the original data satisfying the prescribed (predetermined) data amount (amount of at least one input data block) is transmitted in the buffer memory 101, the control unit 104 starts the coding at the coding unit 102. As the coding system used in the coding unit 102, there can be mentioned orthogonal transformation coding such as for example linear quantization, Fourier transformation, discrete cosine transformation (DCT), modified discrete cosine transform (MDCT), etc. and variable length coding such as Huffman coding. Hereinafter, the data obtained by coding the original data is referred to as the coded data and a block (that is a predetermined unit) of the coded data corresponding to an input data block is referred to as a coded data block. Note that, even when it is difficult to achieve a one-to-one correspondence between the components composing the original data of the input data block input to the input terminal 2 and the components of the results of coding in the coding unit 102 such as in orthogonal transformation coding or variable length coding, the present invention is characterized in that normal access is possible. A detailed description of this will be made later.

The control unit 104 records the coded data of the coded data block obtained from the coding unit 102 via the recording and reproducing means 110 in the data recording medium 105. Further, simultaneously, in preparation for the reproduction of the coded data of the coded data block, the recording position management unit 106 and the reproduction position management unit 107 are made to manage the necessary management data. Note that, the management data managed by these recording position management unit 106 and the reproduction position management unit 107 are recorded in a predetermined recording region of the data a recording medium 105 by the control unit 104. For this reason, in the explanation of the present embodiment, reference to recording the management data in the recording position management unit 106 and the reproduction position management unit 107 means to perform the recording in the predetermined recording region of the data recording medium 105.

Here, as the management data managed by the recording position management unit 106, there can be mentioned the data of the recording position (recording address) on the data recording medium 105 of the coded data block corresponding to the first input data block in each series of recording data, data indicating the amount of recording of the recording data, link data indicating the linkage of coded data blocks, etc. Further, data indicating whether or not the recording data is simultaneously managed also in the reproduction position management unit 107 can be included in the management data. Note that, the recording position data also includes data with which the start position and end position of the recording data in the data recording medium 105 can be calculated and can include also data indicating the correspondence between the selected data and the reproduction position data. Accordingly, it is not necessary to record the recording position data in correspondence to all the coded data blocks. Only the recording position data of the coded data block corresponding to the head of the recording data which should be mainly subjected to random access at for example the time of reproduction need be recorded according to need. In this case, the coded data block subsequent to the coded data block corresponding to the head read by the random access can be read by sequential access by using for example the link data.

On the other hand, as the management data managed by the reproduction position management unit 107, since the data resulting from decoding of the coded data of the coded data blocks by the decoding unit 103 at the time of reproduction is held in the buffer memory 101, there can be mentioned reproduction position (reproduction address) data comprised by data indicating the position which should be accessed on the buffer memory 101 at that time, data indicating the position where the input data block is held in the buffer memory 101, etc. Note that, in the decoding unit 103, where the coded data is for example linear quantized data, inverse quantization corresponding to this is carried out. Also, where the coded data is subjected to Fourier transformation, discrete cosine transformation (DCT), MDCT, etc., the orthogonal inverse transformation corresponding to this is carried out; and when the coded data is subjected to variable length coding such as Huffman coding, the variable length decoding corresponding to this is carried out. Hereinafter, the data decoded by the decoding unit 103 is referred to as the decoded data and one block of the decoded data decoded by the decoding unit 103 and held in the buffer memory 101 is referred to as the reproduction data block.

Note that, the reproduction position data is used because when the data to be subjected to for example random access at the time of reproduction from the data recording medium 105 exists not at the boundaries of the coded data blocks, but in the middle of for example a coded data block, it cannot be managed by the recording position data of the recording position management unit 106. Note that, although a detailed description will be made later, it is possible to manage the data managed by the recording position management unit 106 by the reproduction position management unit 107. Of course, in this case, it is also possible to omit the recording position management unit 106. Namely, it is possible to generate both of the first management data (recording position data) and the second management data (reproduction position data) in the present invention by the reproduction position management unit 107.

On the other hand, at the time of selection of the reproduction function, the function selection means 108 transmits a data selection signal for performing the selection of the data recorded on the data recording medium 105 simultaneously with the selection of the reproduction function to the control unit 104. Note that, the reproduction control procedure in the control unit 104 differs depending upon by which of the recording position management unit 106 or reproduction position management unit 107 the data selected by the data selection signal is managed. Of course, where the selection of data is not carried out, logically the reproduction can be performed in order from the data recorded first in the data recording medium 105. Further, it is possible to have this order managed by the recording data management unit 109 and to change, add to, and delete from the order of the recording data in the recording data management unit 109 according to need.

Accordingly, when the reproduction function is selected in the function selection means 108, the control unit 104 first recognizes the recording data corresponding to the data selection signal from the function selection means 108 which should be reproduced by using the recording data management data managed by the recording data management unit 109. By this, the control unit 104 can obtain the data of the recording position on the data recording medium 105 of the coded data block corresponding to the head position of the recording data selected by the function selection means 108 from the recording position data managed by the recording position management unit 106. Next, the control unit 104 reads the coded data of the coded data block from the recording position on the data recording medium 105 corresponding to the recording position data by controlling the recording and reproducing means 110. Subsequently, the control unit 104 decodes the coded data of the read coded data block in the decoding unit 103 and holds the reproduction data block thereof in the buffer memory 101.

Here, where the head position of the recording data selected in the function selection means 108 coincides with the head position of the coded data block, the control unit 104 outputs the decoded data of the reproduction data block held in the buffer memory 101 as it is from the output terminal 3. On the other hand, where the head position of the recording data selected in the function selection means 108 exists in the middle of a coded data block, the control unit 104 searches for the reproduction position data corresponding to the coded data block from the reproduction position data managed by the reproduction position management unit 107, reads the decoded data of the reproduction data block from the corresponding reproduction position on the buffer memory 101 based on this, and outputs the same to the output terminal 3.

Note that when the buffer memory 101 holds the input data block or the reproduction data block, it is possible to use the recording region in the buffer memory 101 by switching between the recording function and reproduction function and it is possible to individually provide buffer memories for the recording function and for the reproduction function. When the buffer memories are individually provided for the recording function and reproduction function in this way, it becomes possible to easily perform simultaneous operation of the recording function and the reproduction function. The technology enabling the simultaneous operation of the recording function and reproduction function in a data recording and reproduction method or apparatus is disclosed in Japanese Unexamined Patent Publication No. 6-309861 filed in Japan by the present assignee (date of publication Nov. 4, 1994) Note, there is no U.S. patent application corresponding to this Japanese patent application, but an English translation can be submitted if found to be available. The technology disclosed in the publication enables the reproduction of the data required during the recording operation and the recording of data generated during a reproduction operation by controlling the recording operation and reproduction operation with respect to a data recording medium constituted by a semiconductor memory, magnetic disc, or the like to which random access is possible in a time division manner. Further, by repeatedly using the same recording region in the data recording medium, it is possible to perform recording and reproduction of data of more than the recording capacity of the data recording medium. When the technology disclosed in this publication is applied to different buffer memories for the recording function and for reproduction function, it becomes possible to easily perform simultaneous operation of the recording function and reproduction function.

Next, FIG. 4 shows an example of the recording data management data recorded in the recording data management unit 109 of the data recording and reproducing apparatus 1.

As shown in FIG. 4, the recording data management unit 109 can use pointers corresponding to the recording positions on the data recording medium 105 managed by the recording position management unit 106 as the recording data management data. Namely, the recording data management unit 109 provides pointer regions p1 to p256 as the recording regions for recording 256 pointers of from m0 to m255 corresponding to the recording positions on the data recording medium 105 managed by the recording position management unit 106. Note that the pointer regions managed by the recording data management unit 109 are provided on the data recording medium 105. When it is stated in the following explanation that data is recorded in the recording data management unit 109, it means that the data is recorded in the pointer regions provided on the data recording medium 105. Explaining this more concretely, where for example four series of recording data are actually recorded on the data recording medium 105, the recording data management unit 109 uses for example the pointer regions p1 to p4 and the pointers corresponding to the recording positions managed by the recording position management unit 106 are recorded in these pointer regions p1 to p4. FIG. 4 shows an example wherein a pointer m1 is recorded in the pointer region p1, a pointer m2 is recorded in the pointer region p2, a pointer m0 is recorded in the pointer region p3, and a pointer m3 is recorded in the pointer region p4. Further, in the unused pointer regions p5 to p256 other than the used pointer regions p1 to p4, for example −1 is recorded as the pointers m4 to m255. Conversely, by recording pointers of the value of −1 in the unused pointer regions, the control unit 104 can recognize that four series of data are recorded on the data recording medium 105. Note that, in the above example, the pointer regions of p1 to p256 are prepared, but of course it is also possible to set the number of the pointer regions in accordance with the number of the series of recording data recorded in the data recording medium 105.

From this, the control unit 104 can obtain the pointer of the recording position data corresponding to the recording data selected in the function selection means 108 by using the data selection signal. That is, where the selected recording data is logically for example the recording data of the fourth recording position on the data recording medium 105, by setting the data selection signal corresponding to the recording data to p4, the control unit 104 becomes able to obtain the pointer m3 for the recording position data of the recording data selected by the data selection signal by using the recording data management data of the recording data management unit 109. Below, the recording data selected in the above way will be referred to as the selected data (p4:1), a detailed description of which will be given later.

Next, FIG. 5 shows an example of the recording position data to be managed by the recording position management unit 106 of the data recording and reproducing apparatus 1.

In this way, in the recording position management unit 106, the head position and final position of the recording data recorded on the data recording medium 105 and the recording position data enabling the pointers with respect to the reproduction position management unit 107 to be obtained, a detailed description of which will be given later, can be recorded by using the pointers obtained from the recording data management unit 109. Here, this recording position management unit 106, in the case of for example 256 pointers of from m0 to m255, is provided with regions for recording the recording positions s0 to s255 indicating the lead positions of the recording data, recording positions e0 to e255 indicating the final positions, and pointers n0 to n255 with respect to the reproduction position data of the reproduction position management unit 107. Of course, it is also possible to set the number of the recording regions of the recording position data in accordance with the number of the series of recording data recorded in the data recording medium 105.

Note, where reproduction position data corresponding to the data selected by the function selection means 108 does not exist or is not necessary, for example, −1 is recorded as the pointer, thereby enabling the recognition of this at the control unit 104. Note that, in this example, where the recording data selected in the function selection means 108 is logically the recording data at for example the third recording position on the data recording medium 105, since the pointer n0, which is one of the recording position data corresponding to the pointer m0 obtained from the recording data management unit 109, is −1, it is seen that the reproduction position data does not exist in the recording data.

Accordingly, the control unit 104 can obtain the recording position data corresponding to the recording data selected in the function selection unit 108 by using the data selection signal. That is, where the selected recording data is the recording data at for example the fourth recording position logically on the data recording medium 105, that is where the data (p4:1) is selected, as mentioned above, based on the pointer m3 obtained from the recording data management unit 109, the recording position (start position) s3 and the recording position (final position) e3 of the selected recording data and the pointer n3 with respect to the reproduction position data are obtained by using the recording position data of the recording position management unit 106.

Next, FIG. 6 shows an example of the reproduction position data to be managed in the reproduction position management unit 107 of the data recording and reproducing apparatus 1.

In this way, the reproduction position management unit 107 can record the reproduction position data so that the reproduction position in the buffer memory 101 can be obtained by using the pointer obtained from the recording position management unit 106. That is, the reproduction position corresponds to the position (address) at which the reproduction data block is held in the buffer memory 101. Accordingly when the coded data block recorded on the data recording medium 105 is decoded by the decoding unit 103 and temporarily held in the buffer memory 101 as the reproduction data block, the control unit 104 can read the decoded data of the reproduction data block from the buffer memory 101 based on the reproduction position data and output the same from the output terminal 3. In the present embodiment, in the coding unit 102 and the decoding unit 103, the coding and decoding are carried out assembling for example 512 #bits# of data, so the size of the input data block and the reproduction data block is set to 512 and accordingly as the reproduction position, pb0 to pb511 in the figure can be designated as shown in FIG. 6.

Here, in the region in which the reproduction position data is recorded in the reproduction position management unit 107, as mentioned above, correspondence of the coded data block with the reproduction position on the buffer memory 101 s recorded. In the example of FIG. 6, in the case of the pointer n2 with respect to the reproduction position data, the recording data selected in the function selection means 108 starts from the reproduction position pb300 in the buffer memory 101 when the coded data block of the recording position (start position) s2 on the data recording medium 105 is decoded and ends at the reproduction position pb99 in the buffer memory 101 when the coded data block at the recording position (final position) e2 is decoded. Further, it no further existence of the reproduction position data with respect to the selected data is indicated by recording −1 as the pointers of the subsequent regions.

Accordingly, the control unit 104 can obtain the reproduction position data corresponding to the recording data selected in the function selection means 108 by using the data selection signal. That is, in the case where the selected recording data is the third data in the recording data at logically for example the fourth recording position on the data recording medium 105, that is, where data (p4:3) is selected, the control unit 104 can obtain the pointer n3 from the recording position management unit 106 based on the pointer m3 obtained from the recording data management unit 109 as mentioned above, and accordingly the control unit 104 can decide that the selected recording data starts from the reproduction position pb400 of the recording position (s3+1) and ends just before the reproduction position pb0 of the recording position (s3+2), that is, at the reproduction position pb511 of the recording position (s3+1) based on the final pointer (n3+(3−1))=(n3+2) by using the reproduction position data of the reproduction position management unit 107.

Further, it is also possible for the control unit 104 to perform reproduction not only for the recording data, but also for the data up to the final reproduction position corresponding to the recording data to the data selection signal p4, that is, up to the reproduction position pb511 of the recording position e3, even in a case where selected data (p4:3) is selected similar to the above.

In this example, as the reproduction position data of the pointer (n3+3) or (n3+4) with respect to the reproduction position data, the reproduction position becomes pb0. Such a designation is possible even if the recording position data is used, but by performing the designation by using the reproduction position data in this way, even in a case where there is a limitation in the recording regions of the recording position data, for example, a case where the number of the recording regions is limited to 256 as mentioned above, designation can be carried out exceeding that limit.

Note that, it is possible to set the recording regions of the reproduction position data in advance to the prescribed size, but it is also possible to variably set the same in accordance with the number of the reproduction position data. In this case, when use is made of the data recording medium 105 from the lowermost portion, the recording region of the recording data used from the uppermost portion of the data recording medium 105 can be effectively used.

Figures 7A, 7B:
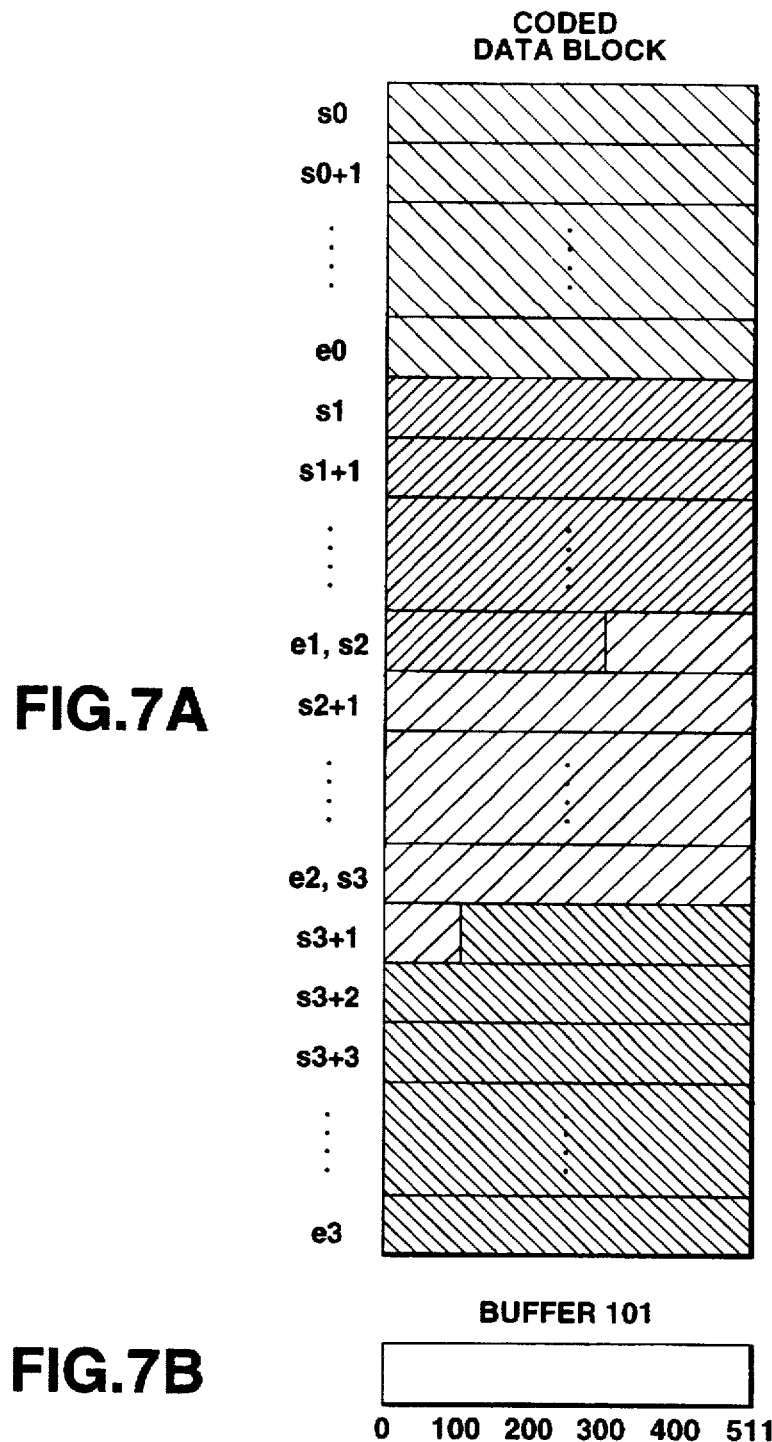
FIGS. 7A and 7B are views (memory map) for explaining the method of recording data on the data recording medium of the data recording and reproducing apparatus of the first embodiment.

Next, FIG. 7A shows the example of a coded data block recorded on the data recording medium 105 of the data recording and reproducing apparatus 1. This is based on the recording data management data in the recording data management unit 109 of FIG. 4, the recording position data in the recording position management unit 106 in FIG. 5, and the reproduction position data in the reproduction position management unit 107 of FIG. 6.

Note that, each row shown in FIG. 7A corresponds to one coded data block. The divisions shown inside the coded data blocks are not the recording positions on the actual data recording medium 105, but are the reproduction positions managed in the reproduction position management unit 107, that is, the positions held in the buffer memory 101 shown in FIG. 7B when the coded data block is decoded by the decoding unit 103, for convenience of explanation.

Here, it is seen that there is no reproduction position data from the recording position management unit 106 based on the pointer m0 obtained from the recording data management unit 109, and it is seen that for example the data (p3:1) is data recorded in a region of from the head of the coded data block of the recording position s0 to the end of the coded data block of the recording position e0.

Similarly, it is seen that the data (p1:1) is the recording data from the reproduction position pb0 of the recording position s1 to the reproduction position pb199 of the recording position s1 from the recording position management unit 106 based on the pointer n1 with respect to the reproduction position data obtained from the pointer m1 with respect to the recording position data and that the data (p1:2) is the recording data from the reproduction position pb200 of the recording position s1 to the reproduction position pb299 of the recording position e1 based on the pointer (n1+1).

Similarly, it is seen that the data (p2:1) is the recording data from the reproduction position pb300 of the recording position s2 to the reproduction position pb99 of the recording position e2 based on the pointer n2 with respect to the reproduction position data obtained from the pointer m2 with respect to the recording position data.

Similarly, it is seen that the data (p4:1) is the recording data from the reproduction position pb100 of the recording position s3 to the reproduction position pb299 of the recording position s3 based on the pointer n3 with respect to the reproduction position data obtained from the pointer m3 with respect to the recording position data; the data (p4:2) is the recording data from the reproduction position pb300 of the recording position s3 to the reproduction position pb399 of the recording position (s3+1) based on the pointer (n3+1); the data (p4:3) is the recording data from the reproduction position pb400 of the recording position (s3+1) to the reproduction position pb511 of the recording position (s3+1) based on the pointer (n3+2) as mentioned above; the data (p4:4) is the recording data from the reproduction position pb0 of the recording position (s3+2) to the reproduction position pb511 of the recording position (s3+2) based on the pointer (n3+3); the data (p4:5) is the recording data from the reproduction position pb0 of the recording position (s3+3) to the reproduction position pb99 of the recording position e3 based on the pointer (n3+4); and the data (p4:6) is the recording data from the reproduction position pb100 of the recording position e3 to the reproduction position pb511 of the recording position e3 based on the pointer (n3+5).

Note that, the data recording medium 105 can be constituted by various recording media such as a read only recording medium, a magneto-optic disc, a magnetic disc, optical disc, a magnetic tape or other tape-like recording medium, etc., a semiconductor memory, and so on, but it is convenient if a semiconductor memory which enables easy random access is used. Further, by using a nonvolatile memory in which the backup of data by a battery is unnecessary, there is no risk that the recording data will disappears, a further reduction of size of the apparatus becomes possible, and the portability is also excellent. By using an electrically rewritable nonvolatile memory such as a flash memory as such a nonvolatile memory, the rewriting of data becomes easy. Note that, as the nonvolatile memory, use can be made of the electrically erasable programmable read only memory (EEPROM) described in "Large Capacity Nonvolatile Memory" by Ito, et. al. (Toshiba Review, 1990, Vol. 45, No. 11, pp. 870–873) and "4M Bit NAND Type EEPROM Suppressing Chip Area to a Minimum" by Tonooka (Electronic Technology 1992-11, pp. 23–27).

Next, the processing in the control unit 104 of the data recording and reproducing apparatus 1 of the embodiment of present invention will be explained using the flowcharts of FIG. 8 and FIG. 9.

Figure 8:
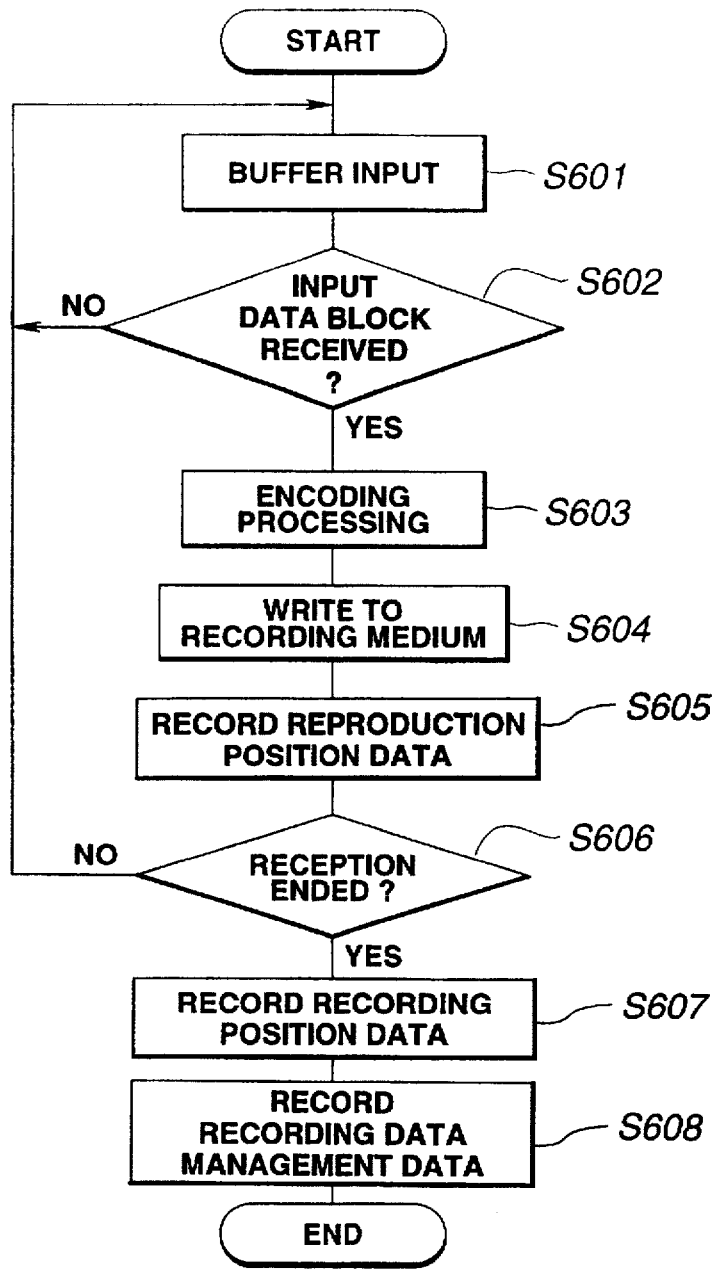
FIG. 8 is a flowchart showing the flow of processing for recording data in the control unit of the data recording and reproducing apparatus of the first embodiment.

First, an example of the flow of processing in the control unit 104 when the recording function is selected in the function selection means 108 will be shown in FIG. 8.

First, at step S601, the control unit 104 holds the input data on the buffer memory 101 until the input data from the input terminal 2 reaches an input data block having a prescribed size, that is, until it is decided YES at step S602. Then, when the reception of the input data block is completed, in the next step S603, the coding with respect to the input data block is carried out. The coded data block which results from this is written in the data recording medium 105 at the next step S604.

At the subsequent step S605, the reproduction position data with respect to the coded data block is recorded in the reproduction position management unit 107 according to need. Here, for example, the user of the apparatus 1 can designate the reproduction position data from the function selection means 108.

The above processing is repeated at step S606 until it is decided that the input of data to the recording and reproducing apparatus 1 is ended (YES). Then, at the next steps S607 and S608, the recording position data and recording data management data as mentioned above are sequentially recorded in the recording position management unit 106 and the recording data management unit 109, respectively, and the recording operation is ended.

Figure 9:
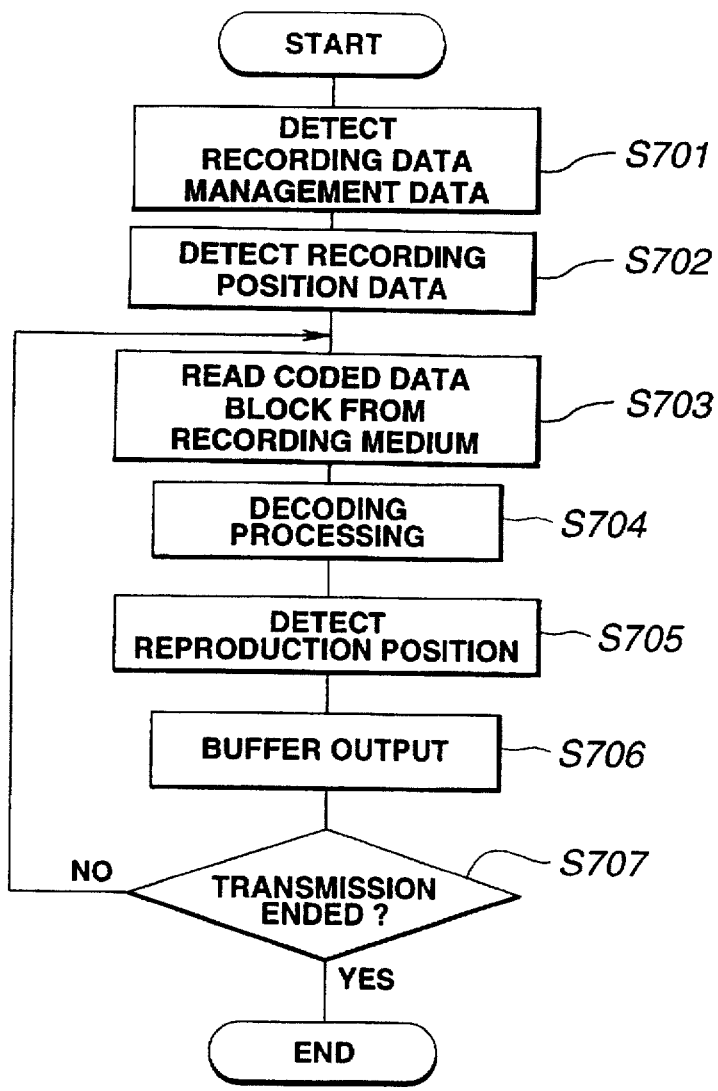
FIG. 9 is a flowchart showing the flow of processing for reproducing data in the control unit of the data recording and reproducing apparatus of the first embodiment.

Next, an example of the flow of processing in the control unit 104 when the reproduction function is selected in the function selection means 108 is shown in FIG. 9.

First, at steps S701 and S702, the control unit 104 sequentially searches for the recording data management data and recording position data from the recording data management unit 109 and the recording position management unit 106 as mentioned above, respectively, based on the data selection signal from the function selection means 108. It reads the coded data block corresponding to the recording position data obtained as a result of this from the data recording medium 105 at the next step S703. Then, at the next step S704, it performs the decoding of the coded data block and holds the reproduction data block resulting from this in the buffer memory 101. Of course, where the coded data block is influenced by the adjacent coded data blocks by the window function etc., they are also simultaneously read and the decoded.

At the subsequent step S705, as mentioned above, if there is reproduction position data with respect to the reproduction data block, it is searched for by the reproduction position management unit 107. Then, based on the reproduction position data obtained as a result of this, at the next step S706, the reproduction data block is transmitted from the output terminal 3 by the buffer memory 101. At the next step S707, the reproduction operation from step S703 is repeated until it is decided that the reproduction and transmission of the selected recording data are ended (YES).

Next, an explanation will be made of another concrete example for realizing the present invention without the use of the recording position management unit 106 by using the memory maps of FIG. 10 and FIG. 11.

FIG. 10 shows an example of the recording data management data recorded in the recording data management unit 109 of the data recording and reproducing apparatus 1 where the recording position management unit 106 is not used as another concrete example of the first embodiment.

The recording data management unit 109 is the same in content as mentioned before referring to FIG. 4 except the pointers n0 to n255 with respect to the reproduction position management unit 107 are recorded in place of the pointers m0 to m255 with respect to the recording position management unit 106.

Accordingly, the control unit 104 can obtain the pointers for the reproduction position data corresponding to the recording data selected in the function selection means 108 from the data selection signal. Namely, where for example data (p4:1) is selected, a pointer n3 with respect to the reproduction position data of the selected recording data can be obtained by using the recording data management data of the recording data management unit 109.

Also in FIG. 11, similarly, an example of the reproduction position data to be recorded in the reproduction position management unit 107 of the data recording and reproducing apparatus 1 where the recording position management unit 106 is not used is shown as a concrete example of the first embodiment. In this case, the recording position data of the data recording medium 105 managed by the recording position management unit 106 will be managed by the reproduction position management unit 107 in correspondence to the reproduction position data of the buffer memory 101 managed by the reproduction position management unit 107.

In this way, in the reproduction position management unit 107, similar to FIG. 6, the reproduction position data is recorded so that the reproduction positions in the buffer memory 101 can be obtained by using the pointers obtained by the recording data management unit 109.

Accordingly, the control unit 104 can obtain the reproduction position data corresponding to the recording data selected in the function selection means 108 from the data selection signal. That is, where for example the data (p4:3) is selected, as mentioned above, the pointer n3 can be obtained from the recording data management unit 109. Accordingly, based on the final pointer (n3+(3−1))=(n3+2), by using the reproduction position management unit 107, it is seen that the selected recording data starts from the reproduction position pb400 of the recording position (s3+1) and ends just before the reproduction position pb0 of the recording position (s3+2), that is, at the reproduction position pb511 of the recording position (s3+1).

Here, where for example the reproduction position data with respect to the data (p3:1) is searched for, in FIG. 6, the recording position data is used, so the reproduction position data is not necessary, but in contrast, the example of FIG. 11 not using the recording position management unit 106 differs in the point that the contents managed by the recording position data must be managed by the reproduction position data. Accordingly, in this FIG. 11, the reproduction position data indicating that the data (p3:1) is recorded in a region from the reproduction position pb0 of the recording position s0 to the reproduction position pb511 of the recording position e0 is added. Of course, however, the data which is actually recorded on the data recording medium 105 is exactly the same in content as in FIG. 7.

Figure 12:
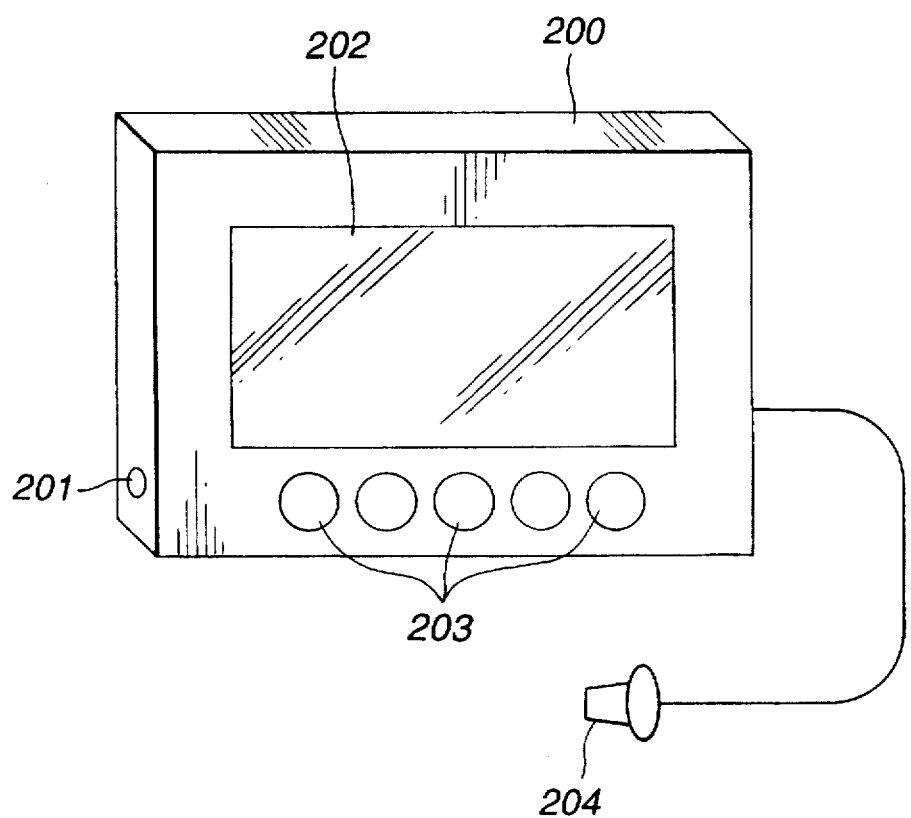
FIG. 12 is a view of the outer appearance of the data recording and reproducing apparatus of the first embodiment.

FIG. 12 shows an outer appearance of the data recording and reproducing apparatus 200 provided with the data recording and reproducing apparatus 1 according to the technology explained in the first embodiment as mentioned above.

A data recording and reproducing apparatus relating to the present application has been proposed in the specification and drawings of U.S. patent application Ser. No. 08/338,538, filed Jan. 11, 1995 by the present assignee.

In the data recording and reproducing apparatus 200 of FIG. 12, a data input terminal 201 is provided. The data can be recorded from outside on the data recording medium disposed in the data recording and reproducing apparatus 200 through this.

Also, the data recording and reproducing apparatus 200 of FIG. 12 is equipped with a display unit 202 and a function selection input unit 203 as the function selection means 108. The contents of the data recorded in the data recording medium can be displayed on the display unit 202, which may be for example a liquid crystal display, plasma display, etc. The user of the data recording and reproducing apparatus 200 can selectively reproduce the necessary data by using the function selection input unit 203, which may comprise buttons, switches, etc. based on the contents displayed here. Note that, the original data may be text data, audio data, video data, computer programs, etc. and is not particularly limited in content. Here, the reproduction of a programs means the execution of that program. In this case, it is also possible for the user to input the data according to need at the time of program execution. Also, where the reproduction signal is text data or a video signal, it can be displayed on the display unit 202 constituted by the liquid crystal device or the like and further, in the case of the audio data, can be output to an earphone 204, etc.

Although not shown in the example of FIG. 12, of course, it is also possible to provide a speaker in place of the earphone 204 or in addition to the earphone 204. In this case, the result of reproduction of the audio data can be output to the speaker. Further, although not drawn in the example of FIG. 12 as well, the reproduction signal can be connected to an outside display device, speaker, etc. by using the external terminal.

Figure 13:
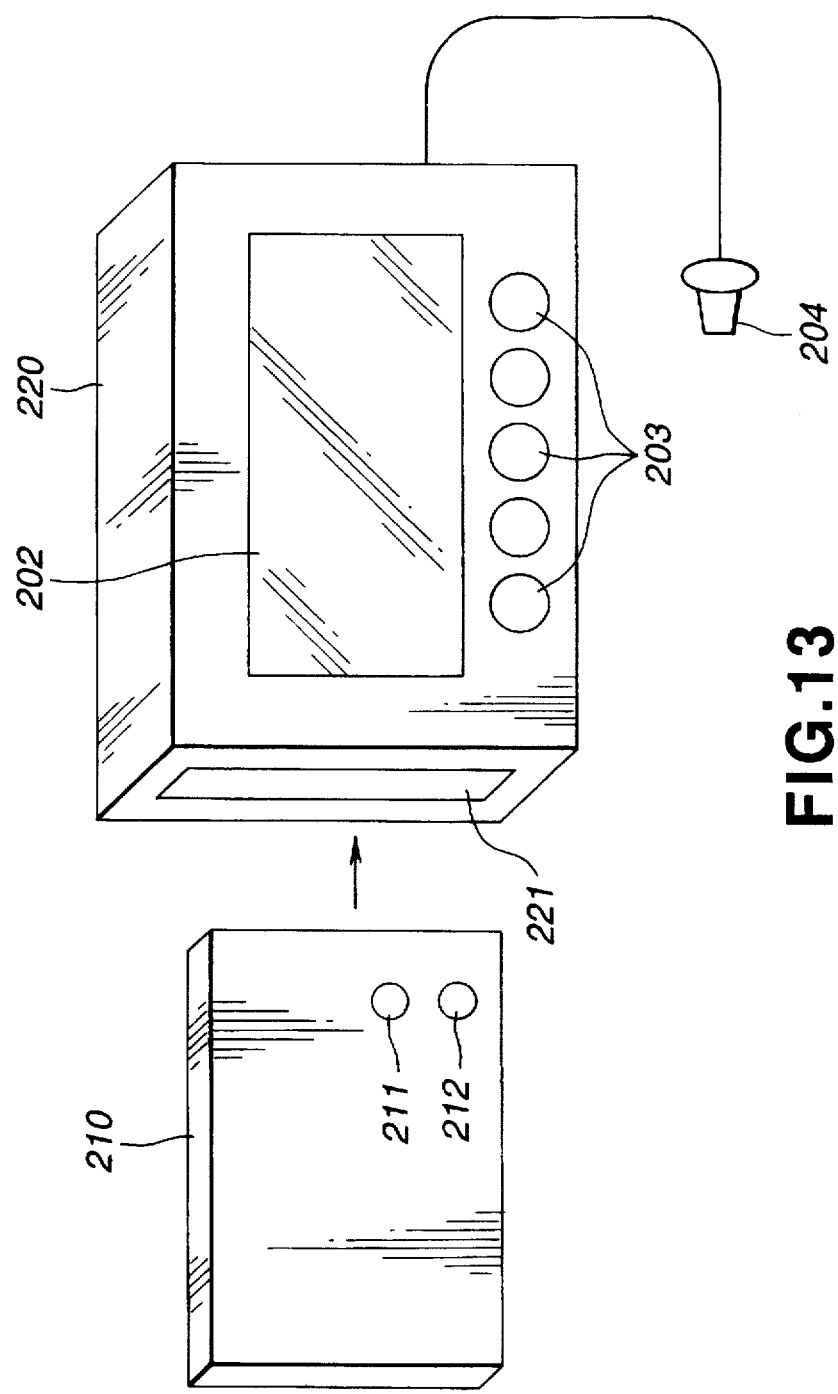
FIG. 13 is another view of the outer appearance of the data recording apparatus and data reproducing apparatus of the first embodiment.

FIG. 13 shows the outer appearance of another example using the technology explained in the first embodiment. In this example, the data recording and reproducing apparatus 200 of FIG. 12 is configured physically separated into a data recording device 210 and a data reproduction device 220. The data reproduction device 220 is provided with the display unit 202 and function selection input unit 203 similar to those of FIG. 12. An earphone 204 can also be attached. Note, at the time of reproduction, the transmission and reception of the data and control signals become necessary between the data recording device 210 and the data reproduction device 220, so terminals for connecting the two are provided in the data recording device 210 and the data reproduction device 220. Further, it is also possible to actually use one terminal as the data input terminal 211 and data reproduction device connecting terminal 212 of the data recording device 210 by switching.

Note that, in the example of FIG. 13, by inserting the data recording device 210 into an insertion and ejecting port 221 of the data reproduction device 220, the data from the data recording device 210 can be transferred to the data reproduction device 220.

As mentioned above, according to the first embodiment of the present invention, in the data recording and reproducing apparatus having a recording medium to which random access is possible, such as a semiconductor memory, the recording data recorded on the recording medium is managed by using the position of the recording data on the recording medium and the position of the reproduced data obtained by reproducing the recording data so that it becomes possible to manage a variety of data in accordance with the desires of the users in more detail and more flexibly even with respect to the recording data to which coding such as the orthogonal transformation coding or variable length coding is applied and so that it becomes possible to perform random access having a higher degree of freedom.

Next, an explanation will be made of a second embodiment of the data processing apparatus to which the data processing method of the present invention is applied by using FIG. 14 and subsequent figures.

Figure 14:
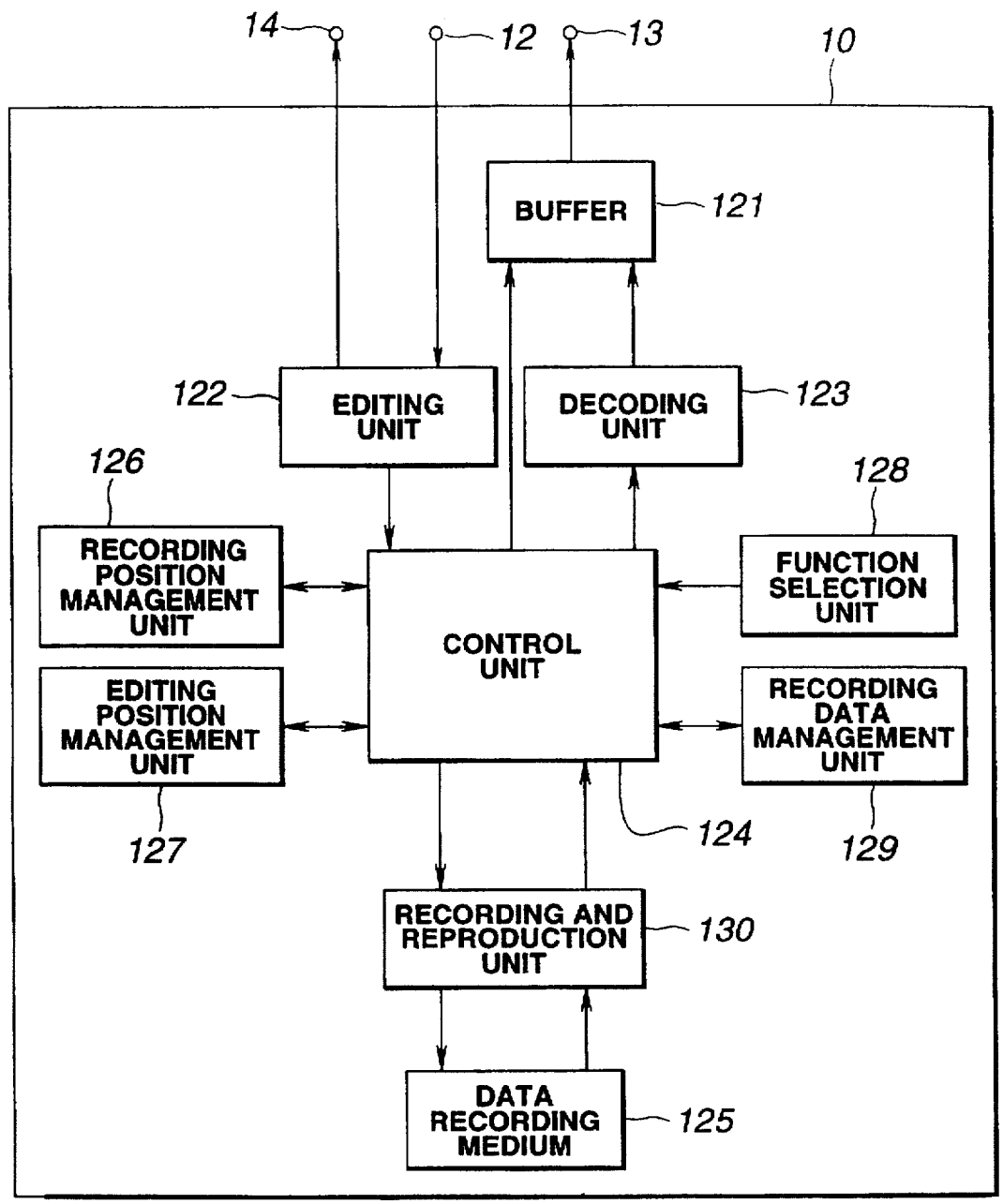
FIG. 14 is a block circuit diagram showing the schematic configuration of the data editing apparatus of a second embodiment of the present invention.

FIG. 14 shows the schematic configuration of a data editing apparatus as the data processing apparatus of the second embodiment of the present invention, in which the editing can be carried out by changing, adding, or deleting the recording position data and reproduction position data of the original data recorded on the data recording medium according to need.

The data editing apparatus 10 shown in FIG. 14 comprises a data recording medium 125 in which the recording data is recorded; a function selection means 128 for performing the selection of the processing to be executed, the selection of the data to be edited, and the selection of the recording data recorded in the data recording medium 125; a data recording medium 125 recording the data which has been coded, that is, the coded data; a recording position management unit 126 which manages the recording position data indicating the position at which the coded data is recorded in at least the data recording medium 125; a decoding unit 123 for decoding the coded data read from the data recording medium 125; a buffer memory 121 for holding the data decoded in the decoding unit 123, that is, the decoded data; an editing position management unit 127 which manages the editing position data indicating the position at which the decoded data (reproduction data) held in the buffer memory 121 should be edited; a recording data management unit 129 which manages the correspondence between the data selected in the function selection means 128, that is, the selected data, and the recording position data or the editing position data; a recording and reproduction unit 130 which records the recording data in the data recording medium 125 or reproduces the recording data from the data recording medium; and a control unit 124 for controlling the respective portions. The control means 124 controls the writing/reading with respect to the buffer memory 121, the writing of the coded data to the data recording medium 125, the recording or reproduction of the management data including the recording position data managed by the recording position management unit 126 to or from the data recording medium 125, the recording or reproduction of the management data including the editing position data managed by the editing position management unit 127 to or from the data recording medium 125, detection of the recording position data and/or the editing position data corresponding to the selected data selected in the function selection means 128, reading of the recording data from the data recording medium 125 based on the detected recording position data, and reading of the decoded data from the buffer memory 121 based on the detected editing position data and transmission of the same to the outside of the apparatus. Namely, in the second embodiment, the editing position data is used as the second management data in the present invention.

In the data editing apparatus 10 shown in FIG. 14, the control unit 124 operates as follows according to the recording or reproduction function selected by the function selection means 128.

First, when the recording function is selected by the function selection means 128, the control unit 124 performs control so that the editing circuit 122 outputs a control signal requesting the transmission of the coded data from the output terminal 14 to an apparatus supplying the data, provided with, for example, a hard disc or optical disc, as the recording medium on the outside of the data editing apparatus 10. Subsequently, the editing unit 122 receives as input the coded data transmitted from the outside of the data editing apparatus 10 from the terminal 12.

Here, as the coded data input to the data editing apparatus 10, there can be adopted data obtained by subjecting the original data to linear quantization at first, orthogonal transformation coding such as Fourier transformation, and variable length coding such as Huffman coding, similar to the coding in the coding unit 102 of the first embodiment. Below, also in this second embodiment, the minimum unit in the coded data such as the frame of FIG. 1 and FIG. 2 will be referred to as the coded data block. Note that, even in a case where it is difficult to establish one-to-one correspondence between the components of the reproduction data output to the output terminal 13 mentioned later and the coded data input to the editing unit 122 as with orthogonal transformation coding and variable length coding, the second embodiment of the present invention has a feature that the editing can be normally carried out. A detailed description of this will be made later. Further, in the editing unit 122, it is possible to designate and edit the start position and end position of the recording in the input coded data, and the coded data can be decoded by the decoding unit 123 and monitored according to need. Further, where the input data has not been coded, it is also possible to code the input data by providing a coding unit in the editing unit 122.

Next, by controlling the recording and reproducing means 130, the control unit 124 records the coded data obtained by the editing unit 122 in the data recording medium 125 for every coded data block and simultaneously records the necessary management data in the recording position management unit 126 for preparation for the reproduction of the coded data blocks.

Here, as the management data to be recorded in the recording position management unit 126, similar to the management data of the recording position management unit 106 of FIG. 3, use can be made of recording position (recording address) data on the data recording medium 125, data indicating the storage capacity of the recording data, link data indicating the linkage of the coded data blocks, etc. Further, also data indicating whether or not the recording data is simultaneously managed also in the editing position management unit 127 can be included in the management data. Note that, the recording position data includes also the data by which the start position and end position in the data recording medium 125 can be calculated. Also, data indicating the correspondence between the recording data and editing position data of the data recording medium 125 can be included. Accordingly, it is not necessary to record the recording position data for all coded data blocks. For example, the recording position data of the coded data block corresponding to the head of the recording data which should be directly accessed mainly at the time of for example reproduction can be recorded according to need. In this case, the coded data blocks subsequent to the directly accessed coded data block can be sequentially accessed by using for example the link data.

Further, the control unit 124 can perform editing such as division, connection, and deletion by using the editing unit 122 not only at the time of the recording of the coded data, but also with respect to the coded data recorded on the data recording medium 125. For this reason, the recording position data and editing position data can be changed, added, and deleted according to need through the control unit 124 by the function selection means 128. That is, the control unit 124 records the necessary management data in the recording position management unit 126 and editing position management unit 127 for preparation for the reproduction of the coded data. Note that, also in the second embodiment, reference to the management data being recorded in the recording position management unit 126 and the editing position management unit 127 means that it is recorded in the predetermined recording region of the data recording medium 125.

Here, as the management data recorded in the editing position management unit 127, the data (reproduction data) resulting from decoding of the coded data of the coded data blocks by the decoding unit 123 is held on the buffer memory 121, so it can be used as data of the positions at which the reproduction data must be connected on the buffer memory 21 at this time, that is, as the editing position (editing address) data when connecting the reproduction data by performing the random access at the editing.

From the above description, as the editing position data, data indicating the connection portions of the musical sound waveform signals α and β in FIGS. 1A and 1B and FIGS. 2A and 2B, for example, the data (d':ed1023) and (f:ed0) in FIGS. 1A and 1B and FIGS. 2A and 2B can be adopted. Here, the data (d':ed1023) indicates the reproduction signal of the editing position ed1023 among 1024 reproduction signals (editing positions ed0 to ed1023) corresponding to the latter half of the transform window D when inverse transforming the frame d, and similarly the data (f':ed0) indicates the reproduction signal of the editing position ed0 among 1024 reproduction signals corresponding to the latter half of the transform window F when inverse transforming the frame f.

It should be noted here that the recording must be performed up to the coded data block with which the reproduction signal of the desired editing position can be completely decoded in the data recording medium 125. That is, in FIGS. 1C, 1D, 1E, and 1F and FIGS. 2B and 2C, where the editing position should be designated in the latter half portion of the transform window F, the recording must be performed not from the frame g, but from the frame f in the data recording medium 125.

On the other hand, in the function selection means 128, at the time of selection of the reproduction function, it becomes possible to simultaneously transmit the data selection signal for performing the selection of the data recorded on the data recording medium 125 to the control unit 124 at the time of the selection of the reproduction function. The reproduction control procedure in this control unit 124 differs depending upon whether or not the coded data blocks of the data selected by the function selection means 128 are managed at the editing position management unit 127. Of course, where the selection of data is not carried out, the reproduction can be sequentially carried out from the data logically recorded at the first position in the data recording medium 125. Further, such an order is managed in the recording data management unit 129, so the change, addition, and delete of order of the recording data becomes possible according to need.

Accordingly, when the reproduction function is selected at the function selection means 128, the control unit 124 first recognizes the recording data corresponding to the data selection signal from the function selection means 128 to be reproduced by using the recording data management data managed by the recording data management unit 129. By this, the control unit 124 can obtain the recording position on the data recording medium 125 of the coded data block corresponding to the head position of the recording data selected at the function selection means 128 from the recording position data managed by the recording position management unit 126.

Next, the control unit 124 reads the first coded data block from the recording position on the data recording medium 125 corresponding to the recording position data by controlling the recording and reproducing means 130. Subsequently, the read first coded data block is decoded at the decoding unit 123, and the reproduction data of the obtained reproduction data block is held in the buffer memory 121. Note that, in the decoding unit 123, similar to the first embodiment, where the coded data is for example the result of linear quantization, inverse quantization corresponding to this is carried out; where the coded data is the result of Fourier transformation, discrete cosine transformation (DCT), MDCT, or the like, the orthogonal inverse transformation corresponding to this is carried out; and where the coded data is the result of variable length coding such as Huffman coding, variable length decoding corresponding to this is carried out. Also in this second embodiment, the data decoded by the decoding unit 123 is referred to as the decoded data, and one block of the decoded data decoded by the decoding unit 123 and held on the buffer memory 121 is referred to as the reproduction data block. In the example of FIG. 1 and FIG. 2, 1024 reproduction signals which are a latter half portion of each transform window corresponds to the reproduction data block. Further, also in this second embodiment, the data holding function of the buffer memory 121 can be replaced by using one part of recording region of the data recording medium 125. If the data holding function of the buffer memory 121 is replaced by one part of the recording region of the data recording medium 125 in this way, it is also possible to omit the buffer memory 121. If the buffer memory 121 is omitted, it becomes possible to simplify the data editing apparatus 10.

Where the first coded data block is not the object of the management in the editing position management unit 127, the first reproduction data block corresponding to this is output as it is from the output terminal 13. On the other hand, where the first coded data block is designated as an editing position at the editing position management unit 127, the editing position management unit 127 searches for the editing position data of the second coded data block subsequent to the first coded data block. Then, the coded data of the second coded data block is read from the data recording medium 125, decoded in the decoding unit 123, and held as the second reproduction data block in the buffer memory 121. Then, though a detailed description will be made later, the first and second reproduction data blocks are connected from the corresponding editing position on the buffer memory 121 based on the editing position data and output to the output terminal 13.

Next, FIG. 15 shows an example of the recording data management data recorded in the recording data management unit 129 of the data editing apparatus 10 of the second embodiment.

This recording data management data has generally the same configuration as that of the recording data management data recorded in the recording data management unit 109 of the data recording and reproducing apparatus 1 of the first embodiment. Explaining this with reference to FIG. 14 which shows the configuration of the second embodiment, however, in the recording data management unit 129, pointers corresponding to the respective recording positions on the data recording medium 125 managed by the recording position management unit 126 can be recorded. For example, pointer regions p1 to p256 for recording 256 pointers of from m0 to m255 are prepared. Where there are four series of recording data recorded on the data recording medium 125, the pointer regions p1 to p4 are used. Then, by recording for example −1 in the pointer regions p5 to p256, the control unit 124 can recognize that four data are recorded in the data recording medium 125. Of course, it is also possible to set the number of the storage regions of the pointers in accordance with the number of series of the recording data recorded in the data recording medium 125.

Accordingly, the control unit 124 can obtain the pointers of the recording position data corresponding to the recording data selected in the function selection means 128 by using the data selection signal. Namely, where the selected recording data is for example logically the fourth recording data on the data recording medium 125, by setting the data selection signal corresponding to the recording data to p4, the pointer m3 with respect to the recording position data of the selected recording data is obtained by using the recording data management unit 129. Thereafter, the recording data selected in the above way will be referred to as the data p4.

Next, FIG. 16 shows an example of the recording position data recorded in the recording position management unit 126 of the data editing apparatus 10. This recording position data has schematically the same structure as that of the recording position data recorded in the recording position management unit 106 of the data recording and reproducing apparatus 1 of the first embodiment. When explaining this in reference to FIG. 14 showing the configuration of the second embodiment, however, the recording position management unit 126 can use the pointers obtained by the recording data management unit 129 to record the recording position data so that the head position and last position of the recording data recorded on the data recording medium 125 and, although a detailed description will be made later, pointers with respect to the editing position management unit 127 can be obtained. Here, with respect to for example the 256 pointers m0 to m255, regions for recording positions s0 to s255 indicating the head position of the recording data, recording positions e0 to e255 indicating the last position, and recording pointers n0 to 255 with respect to the editing position data of the editing position management unit 127 are prepared. Of course, it is also possible to set the number of the storage regions of the recording position data in accordance with the number of series of the recording data recorded on the data recording medium 125.

Note, where the editing position data corresponding to the data selected by the function selection means 128 does not exist or is not necessary, for example, this can be recognized at the control unit 124 by recording −1 as the pointer. In this example, where the recording data selected in the function selection means 128 is for example logically the third recording data, that is, the data p3 on the data recording medium 125, since the pointer n0, which is one of the recording position data corresponding to the pointer m0 obtained by the recording data management unit 129, is −1, it is seen that there is no editing position data in the recording data.

Accordingly, the control unit 124 can obtain the recording position data corresponding to the recording data selected in the function selection means 128 by using the data selection signal. That is, where the selected recording data is for example logically the fourth data on the data recording medium 125, that is, where the data p4 is selected, as mentioned above, based on the pointer m3 obtained by the recording data management means 109, the recording position (start position) s3 and the recording position (final position) e3 of the selected recording data and the pointer n3 with respect to the editing position data are obtained.

Next, FIG. 17 shows an example of the editing position data recorded in the editing position management unit 127 of the data editing apparatus 10.

In this way, in the editing position management unit 127, the editing position data can be recorded by using the pointers obtained by the recording position management unit 126 so that the editing positions in the buffer memory 121 are obtained. Namely, the editing positions correspond to the positions at which a plurality of reproduction data blocks on the buffer memory 121 are connected. Accordingly, in the apparatus 10 of the present embodiment, the coded data block recorded on the data recording medium 125 is decoded by the decoding unit 123, is temporarily held on the buffer memory 121 as the reproduction data block, and then when the reproduction data block is output to the output terminal 13, can be output after performing random access based on the editing position data. In this second embodiment, the coded data block is the result of assembling and coding 2048 sample values as shown in FIGS. 1A, 1B, 1C, 1D, 1E, and 1F and FIGS. 2A, 2B, and 2C, but due to the influence of the window function in the orthogonal inverse transformation, the size of the actual reproduction data block becomes 1024, and accordingly ed0 to ed1023 can be designated as the editing positions with respect to the reproduction data blocks.

Here, the editing position management unit 127 records the correspondence of the editing positions in the buffer memory 121 with respect to the coded data blocks in the region for recording the editing position data. In the example of FIG. 17, in the case of the pointer n2 with respect to the editing position data, together with the pointer (n2+1), the recording data selected in the function selection means 128 indicates that editing is carried out to randomly access the editing position ed200 to the editing position ed600 in the buffer memory 121 and connect the reproduction data when the coded data block of the recording position s2 on the data recording medium 125 is decoded and the result thereof is output from the buffer memory 121 to the output terminal 13. Further, the indication of −1 in the subsequent region shows that editing position data with respect to the selected data no longer exists.

Accordingly, the control unit 124 can obtain the editing position data corresponding to the recording data selected in the function selection means 128 by using the data selection signal. That is, where the selected recording data is for example logically the fourth data on the data recording medium 125, that is, where the data p4 is selected, as mentioned above, based on the pointer m3 obtained from the recording data management unit 129, it is seen that the data is recorded from the recording position s3 to the recording position e3 by the recording position management unit 126 and, at the same time, the pointer n3 can be obtained.

Then, based on the obtained pointer n3 and the next pointer (n3+1), by using the editing position management unit 127, in the selected recording data, it is indicated that the editing position ed1023 of the recording position s3 and the editing position ed0 of the recording position (s3+2) are connected and, similarly, by the subsequent editing position data, the editing position ed600 of the recording position (s3+3) and the editing position ed200 of the recording position (s3+4) are connected in the recording data.

Note that, it is also possible to set the recording region of the editing position data to the prescribed size in advance, but it is also possible to variably set the same in accordance with the number of series of the editing position data. In this case, where use is made of the data recording medium 125 from the lowermost portion, the recording region of the recording data to be used from the uppermost portion of the data recording medium 125 can be effectively used.

Figures 18A, 18B:
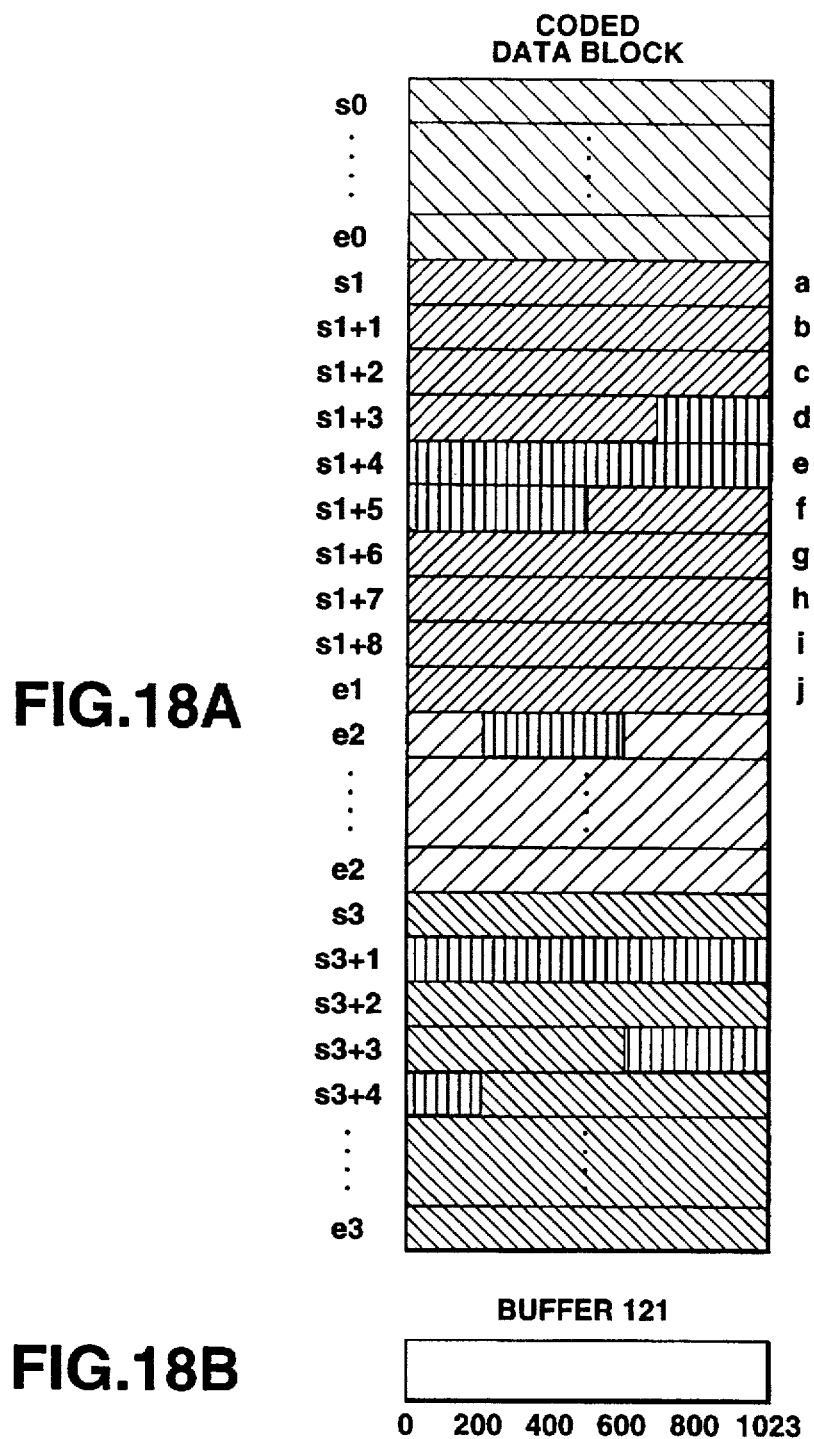
FIGS. 18A and 18B are views (memory map) for explaining the method of recording data in the data recording medium of the data editing apparatus of the second embodiment.

Next, FIG. 18A shows an example of the coded data block recorded in the data recording medium 125 of the data editing apparatus 10 and is based on the example in the recording data management data in the recording data management unit 129 of FIG. 15, the recording position data in the recording position management unit 126 of FIG. 16, and the editing position data in the editing position management unit 127 of FIG. 17.

Note that, each row shown in FIG. 18A corresponds to one coded data block, and the divisions illustrated inside the coded data blocks are not the recording positions on the actual data recording medium 125, but the editing positions managed in the editing position management unit 127, that is, the positions in the buffer memory 121 when the coded data blocks are decoded by the decoding unit 123 and then held on the buffer memory 121 shown in FIG. 18B for convenience of explanation. Note, as the buffer memory 121 shown in the figure, a buffer memory having a capacity of an amount of one reproduction data block is shown for a convenience of explanation, but in actuality, as will be mentioned later, it has a capacity of an amount of two or more reproduction data blocks.

Here, for example, based on the pointer m0 obtained by the recording data management unit 129, it is seen that the editing position data does not exist from the recording position management unit 126, and the data p3 is the data recorded in a region from the coded data block at the recording position s0 to the coded data block at the recording position e0.

Similarly, it is seen that the data p1 is the recording data indicated by the coded data blocks a to j from the recording position s1 to the recording position e1 by the pointer m1 with respect to the recording position data, and further, based on the pointers n1 and (n1+1) with respect to the obtained editing position data, it is seen that the editing position ed720 of the recording position (s1+3) and the editing position ed512 of the recording position (s1+5) are connected by editing.

Similarly, it is seen that the data p2 is the recording data from the recording position s2 to the recording position e2 by the pointer m2 with respect to the recording position data, and further, based on the pointers n2 and (n2+1) with respect to the obtained editing position data, it is seen that the editing position ed200 of the recording position s2 and the editing position ed600 are connected by editing.

Similarly, it is seen that the data p4 is the recording data from the recording position s3 to the recording position e3 by the pointer m3 with respect to the recording position data, based on the pointers n3 and (n3+1) with respect to the obtained editing position data, it is seen that the editing position ed1023 of the recording position s3 and the editing position ed0 of the recording position (s3+2) are connected by editing, and, further, based on the subsequent pointers (n3+2) and (n3+3), it is seen that the editing position ed600 of the recording position (s3+3) and the editing position ed200 of the recording position (s3+4) are connected by editing.

Accordingly, when the respective coded data blocks are decoded by the decoding unit 123 and held in the buffer memory 121 as the reproduction data block, the reproduction data corresponding to the black painted portion in FIG. 18A will not be output.

Note that, also in the second embodiment, similar to the first embodiment, the data recording medium 125 can be constituted by various recording media. It is convenient if a semiconductor memory, which can be easily randomly access, is used. Further,.by using a nonvolatile memory not requiring backup of the data by a battery, there is no risk that the recorded data will disappear and it is excellent also in portability. As a concrete example of such a nonvolatile memory, a nonvolatile memory similar to that of the first embodiment can be used.

Here, a more detailed explanation of the editing position in the buffer memory 121 will be made using FIGS. 19A, 19B, and 19C and FIG. 20 and FIG. 21.

In these FIGS. 19A, 19B, and 19C, similar to FIG. 2 mentioned above, time series data is indicated in FIG. 19A, a transform window is indicated in FIG. 19B, and the frame (coded data block) is indicated in FIG. 19C. These figures illustrate only the center portion which is the connection portion of the musical sound waveform signals α and β of FIG. 2. They indicate the reproduction data in which the interior of a square frame fr shown on the musical sound waveform signal of FIG. 19A is held in the buffer memory 121. Accordingly, if the reproduction data is recorded in the buffer memory 121, it is possible to connect any two points of reproduction signals by editing. That is, these two points which should be connected are editing positions and are recorded in the editing position management unit 127.

Namely, as mentioned above, where the recording data selected in the function selection means 128 is for example logically the first data on the data recording medium 125, that is, where the data p1 is selected, the control unit 124 can recognize that the selected recording data is recorded in a region from the recording position s1 to the recording position e1 from the recording position management unit 126 based on the pointer m1 obtained by the recording data management unit 129 and, at the same time, obtain the pointer n1. By this, based on the obtained pointer n1 and the next pointer (n1+1), by using the editing position management unit 127, in the selected recording data, it is seen that the editing position ed720 of the recording position (s1+3) and the editing position ed512 of the recording position (s1+5) are connected by editing.

Accordingly, at the time of the reproduction, first the coded data blocks d and f corresponding to the respective recording positions are decoded at the decoding unit 123, and the results thereof are held in the buffer memory 121. This situation is shown in FIG. 19A. Note, the decoding of MDCT is influenced by the adjacent frames (coded data blocks) due to the window function, so the reproduction data block d' is first found from the frames (coded data blocks) d and e by the transform windows D and E, respectively, and next the reproduction data block e' is found from the frame (coded data block) f by the transform window F. Then, further the reproduction data blocks f' will be found from the frame (coded data block) g in order by the transform window G.

Next, the decoded three reproduction data blocks are sequentially output from the buffer memory 121 to the output terminal 13, but in actuality, after the positions ed0 to ed720 of the reproduction data block d' are output, the positions ed512 to ed1023 of the reproduction data block f' are output.

Figure 20:
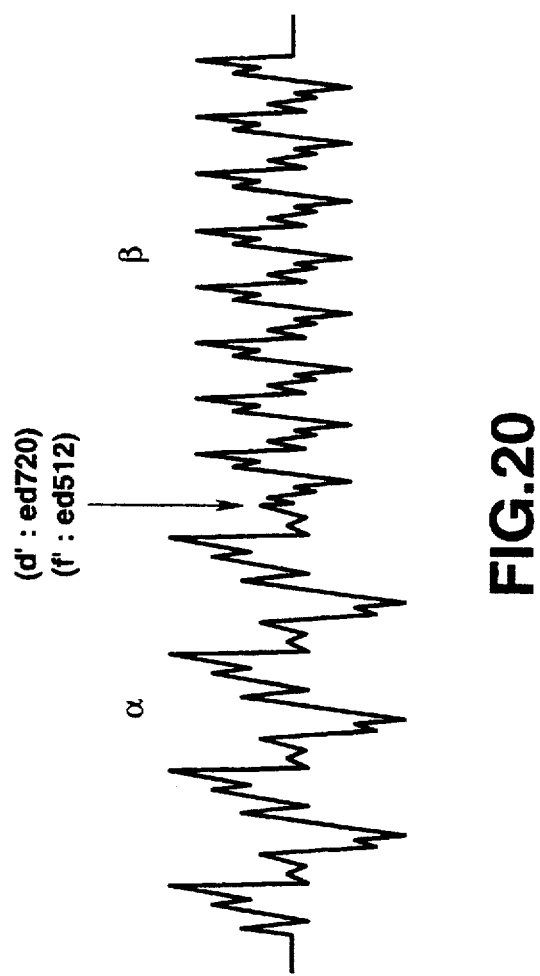
FIG. 20 is a view for explaining the reproduction data output from an output terminal of the data editing apparatus of the second embodiment.

That is, by sequentially outputting the reproduction signals of from the address 0 to address 720 of the buffer memory 121 shown in FIGS. 19A, 19B, and 19C and reproduction signals of from the address (1024×2+512)= 2560 to the address (1024×2+1023)=3071, the output signal from the output terminal 13 becomes the musical sound waveform signal as shown in FIG. 20.

Figure 21:
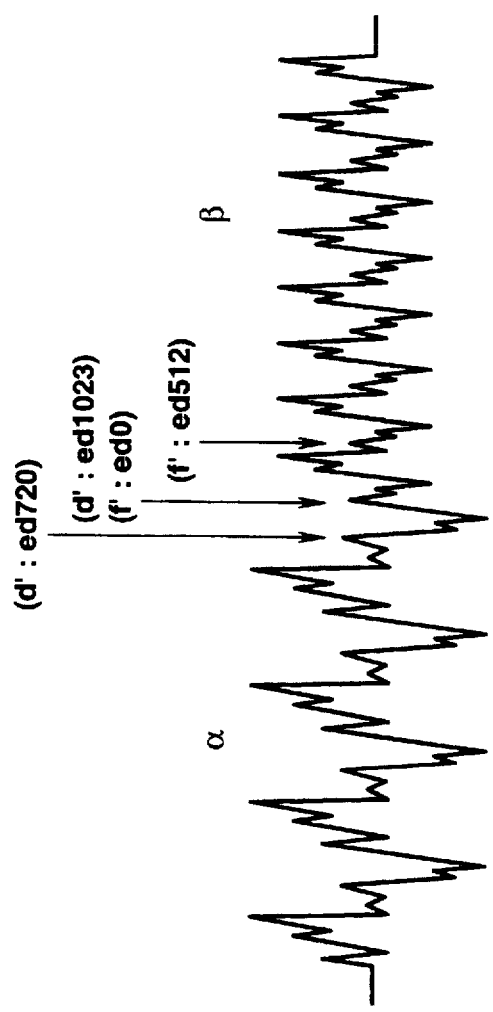
FIG. 21 is a view for explaining other reproduction data output from the output terminal of the data editing apparatus of the second embodiment.

Similarly, in the editing position management unit 127, when it is assumed that for example the position ed1023 of the reproduction data block d' and the position ed0 of the reproduction data block f' are connected by editing, the output signal from the output terminal 13 becomes the musical sound waveform signal as shown in FIG. 21. By this, it is seen that an inconvenience occurring in the connection portion of the coded data blocks in two different data as mentioned above can be solved.

Note that, in the above FIGS. 19A, 19B, and 19C, a storage region of the amount of three reproduction data blocks is secured as the storage region of the buffer memory 121, but of course in the control unit 124, by performing control so as not to hold the reproduction data block e' in the above example, a storage region of the amount of two reproduction data blocks can be constituted. Further, by using a ring buffer as such a buffer memory 121 similar to the first embodiment, the reproduction data can be output from the output terminal 13 with a good efficiency.

Further, by using the similar principle, not only can the connection portion of two different data be edited as in the above example, but also the data can be connected to the recording data at far recording position. Further, it is also possible to perform the editing in the same reproduction data block of the same data or among different reproduction data blocks. Needless to say these are included in the present invention.

The most important characteristic feature of the present invention is that a buffer memory which can hold two or more reproduction data blocks is provided and that by managing the editing positions on the buffer memory, the edited reproduction data can be output irrespective of the nature of the coded data block and the recording position on the recording medium.

Next, the processing in the control unit 124 of the data editing apparatus 10 of the second embodiment of the present invention will be explained by using the flowcharts of FIG. 22 and FIG. 23.

Figure 22:
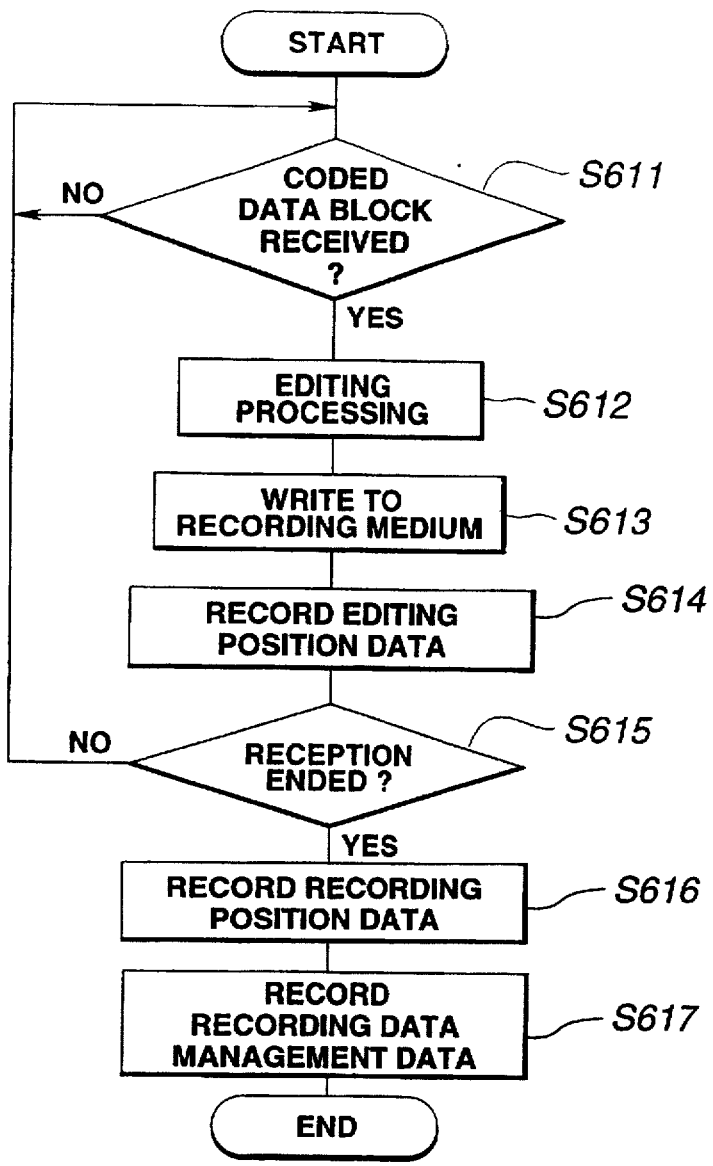
FIG. 22 is a flowchart showing the flow of processing for recording data in the control unit of the data editing apparatus of the second embodiment.

First, an example of the flow of processing in the control unit 124 when the recording function is selected in the function selection means 128 will be shown in FIG. 22.

First, at step S611, when receiving the coded data block input from the input terminal 12 (YES), the control unit 124 performs the editing with respect to the coded data block at the next step S612 and then writes the same in the data recording medium 125 at the next step S613.

Here, the editing to be performed by the editing unit 122 can be carried out according to need. Usually the input coded data block can be recorded as it is in the data recording medium 125 at the next step S613. That is, when two coded data are edited and recorded as one coded data, it is sufficient so far as the editing is carried out only with respect to the coded data block corresponding to the connection portion of one coded data and the other coded data. This is also true for the editing with respect to the recording data recorded on the data recording medium 125. By changing the editing position data in the editing position management unit 127, editing such as division, connection, and deletion of the recording data can be carried out.

At the subsequent step S614, the editing position data with respect to the coded data block for which the editing was carried out is recorded in the editing position management unit 127 according to need. Here, for example the user of the data editing apparatus 10 can designate the editing position data by the function selection means 128.

The above processing is repeated at step S615 until it is decided that the input of the data to the data editing apparatus 10 is ended (YES). Then, at the next steps S616 and S617, the recording position data and the recording data management data as mentioned above are sequentially recorded in the recording position management unit 126 and the recording data management unit 129, respectively, and the recording operation is ended.

Figure 23:
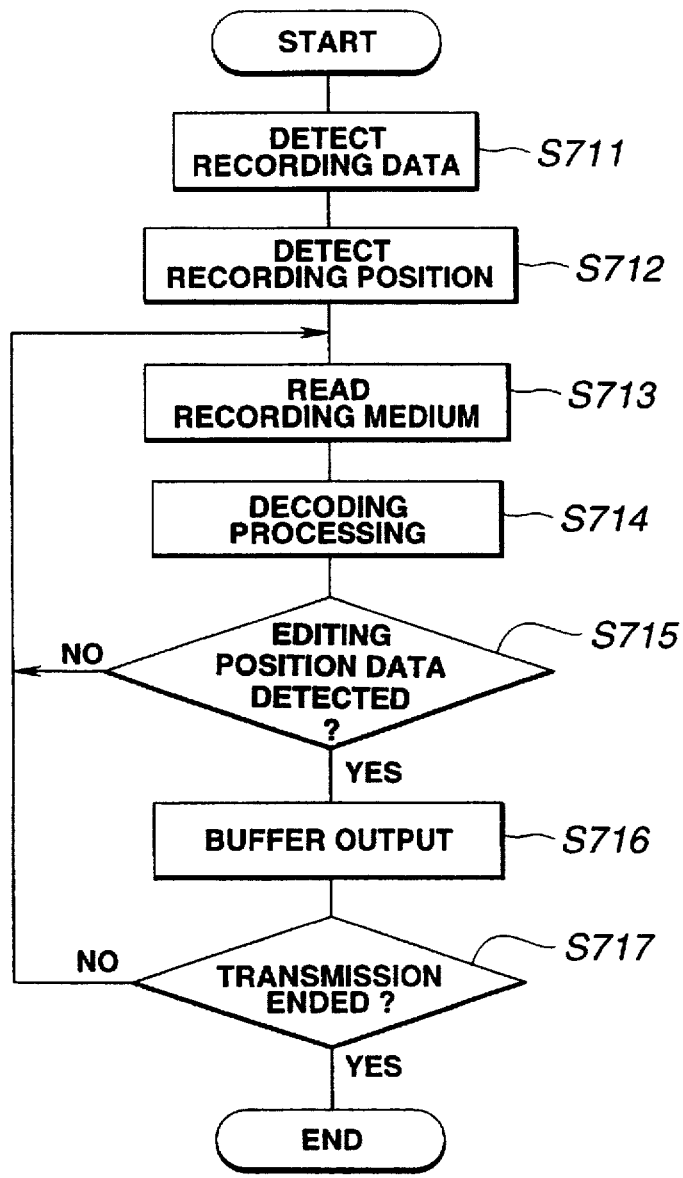
FIG. 23 is a flowchart showing the flow of processing for reproducing data in the control unit of the data editing apparatus of the second embodiment.

Next, FIG. 23 shows an example of the flow of processing in the control unit 124 when the reproduction function is selected in the function selection means 128.

First, at steps S711 and S712, the control unit 124 sequentially searches for the recording data management data and the recording position data from the recording data management unit 129 and the recording position management unit 126 based on the data selection signal from the function selection means 128, respectively. Then, it reads the first coded data block corresponding to the recording position data obtained as a result of this from the data recording medium 125 at the next step S713.

Then, at next step S714, it performs the decoding with respect to the coded data block and holds the first reproduction data block resulting from this in the buffer memory 121. Of course where the coded data block is influenced by the adjacent coded data blocks by the window function etc. the adjacent blocks will be simultaneously read and decoded too.

At the subsequent step S715, as mentioned before, if there is editing position data with respect to the first reproduction data block (YES), the control unit 124 searches for the data from the editing position management unit 127. The, based on the editing position data obtained as a result of this, the processing routine returns to step S713, at which the necessary second coded data block is read and then the decoded second reproduction data block is held in the buffer memory 121.

At the next step S716, the first reproduction data block is transmitted from the buffer memory 121 through the output terminal 13. Then, where the editing position data is detected at the step S715, based on the editing position, the second reproduction data block is subsequently output. Then, at the next step S717, the reproduction operation from the step S713 is repeated until it is decided that the reproduction and transmission of the selected recording data are ended (YES).

Figure 24:
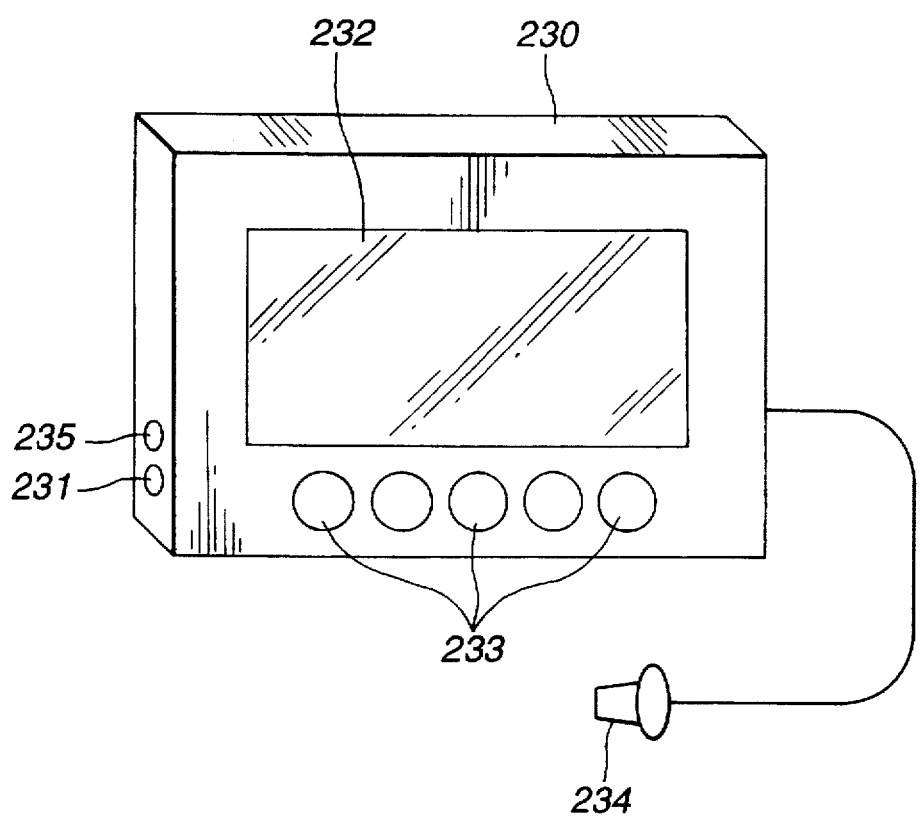
FIG. 24 is a view of the outer appearance of the data editing apparatus of the second embodiment.

FIG. 24 shows the outer appearance of a data editing apparatus 230 provided with a data editing apparatus 10 according to the technology explained in the second embodiment.

In this data editing apparatus 230 of FIG. 24, a data input terminal 231 and a control signal output terminal 235 are provided. In accordance with the control signal output from the control signal output terminal 235, data input from the outside through the data input terminal 231 can be recorded in the data recording medium disposed in the data editing apparatus 230.

Further, the data editing apparatus 230 of FIG. 24 is equipped with a display unit 232 and a function selection input unit 233 similar to those of FIG. 10 of the first embodiment. The display unit 232 can display the contents of data to be input to the data editing apparatus 230 and data recorded in the data recording medium. The user of the data editing apparatus 230 can selectively record, edit, and reproduce the required coded data based on the contents displayed here and by using the function selection input unit 233, which is comprises of buttons, switches, etc. Note that, the coded data include text data, audio data, video data, and computer programs in content similar to the first embodiment and is not particularly limited. Here too, the "reproduction of a program" means the execution of that program, but in this case, it is also possible for the user to input data in accordance with need at the time of the program execution. Further, where the reproduction signal is text data or a video signal, it can be displayed on a display unit 232 constituted by a liquid crystal device or the like, and further in the case of audio data, it can be output to an earphone 234, etc.

Although not shown in the example of FIG. 24, it is also possible to provide a speaker in place of the earphone 234 or in addition to the earphone 234 similar to the first embodiment. In this case, the result of reproduction of the audio data can be output to the speaker. Further, although not shown in the example of FIG. 24 as well, it is also possible to connect the reproduction signal to an outside display device, speaker, etc. by using the external terminal.

FIG. 25 is a view of the outer appearance of another example using the technology of the second embodiment. In this example, the data editing apparatus 230 of FIG. 24 is constituted physically separated into the data recording device 240 and the data reproduction device 250. Note, at the time of reproduction, the transmission and reception of data and control signals become necessary between the data recording device 240 and the data reproduction device 250, so terminals for connecting the two are provided in the data recording device 240 and the data reproduction device 250. Further, it is also possible to use one terminal as the data input terminal 241 of the data recording device 240 and the data reproduction device connecting terminal 242 by switching.

Note that, in the example of FIG. 25, by inserting the data recording device 240 into the insertion and ejecting port 251 of the data reproduction device 250, the data from the data recording device 240 can be transferred to the data reproduction device 250.

Note that, the data recording medium in the data editing apparatus is not particularly limited in type similar to the first embodiment, but it is convenient if a semiconductor memory or a disc medium to which random access is possible is used. Further, by using a nonvolatile memory, a power source for holding the data becomes unnecessary and a further reduction of size of the apparatus becomes possible. Further, by using an electrically rewritable nonvolatile memory such as a flash memory, the rewriting of data can be easily carried out.

From the above description, according to the second embodiment of the present invention, in the data editing apparatus having a recording medium to which random access is possible such as a semiconductor memory, by editing the recording data recorded in the recording medium by using the position of the recording data on the recording medium and the position of the reproduced data obtained by reproducing the recording data, it becomes possible to perform the editing of a variety of data in accordance with the desire of the users in more detail and with a higher degree of freedom irrespective of the limits such as the frames and blocks even with respect to recording data subjected to coding such as orthogonal transformation coding or variable length coding.

Due to this, by using the apparatus of the present invention, it is possible to perform the recording, reproduction, and editing of a variety of data irrespective of the components or nature of the recording data and to perform the management and editing of data in more detail.

As is apparent also from the above explanation, in the present invention, when data to be processed in predetermined units is handled, the data which must be handled in predetermined units is managed in predetermined units, and the data which does not have to be handled in predetermined units is managed in units smaller than the predetermined units, so when recording a variety of data, managing reproduction, and editing such as division, connection, and deletion, it becomes possible to perform the management and editing of finer data irrespective of the data structure and the components or nature of the recording data.

Note that, a variety of modifications and applications can be considered within the range of the present invention. Accordingly, the present invention is not limited to the embodiments.

What is claimed is:

1. A data recording and reproducing apparatus comprising:

an input terminal and an output terminal;

a coding means for coding input data supplied to the input terminal and outputting coded data blocks;

a data recording medium for recording the coded data blocks;

a recording and reproducing means for recording the coded data blocks on the data recording medium and reproducing the coded data blocks from the data recording medium;

a recording position management means for managing recording position data indicating positions at which the coded data blocks are recorded on the data recording medium by the recording and reproducing means;

a decoding means for decoding the coded data blocks reproduced from the data recording medium by the recording and reproducing means;

a buffer memory connected to the input terminal and the output terminal for temporarily storing the input data before outputting it in predetermined amounts to the coding means and for temporarily storing decoded data output by the decoding means before outputting it to the output terminal;

a reproduction position management means for managing reproduction position management data indicating positions at which the input data is held in the buffer memory and positions at which the decoded data is held in the buffer memory;

a function selection means for selecting a processing to be executed, data which is held in the buffer memory, and coded data blocks recorded on the data recording medium;

a recording data management means for managing a correspondence between either or both of the data and coded data blocks selected by the function selection means, on the one hand, and either or both of the recording position data and the reproduction position data, on the other hand, and a controller responsive to the function selection means for controlling the coding means, the recording and reproducing means, the recording position management means, the decoding means, the buffer memory, the reproduction position management means, and the recording data management means.

2. A data recording and reproducing apparatus according to claim 1, wherein:

the recording position data managed by the recording position management means includes recording addresses on the data recording medium of a coded data block corresponding to a first input data block in each of a series of recorded coded data blocks, data indicating an amount of recorded data in the series of recorded coded data blocks, and link data indicating a linkage of coded data blocks.

3. A data recording and reproducing apparatus according to claim 2, wherein:

the recording position data managed by the recording position management means further includes data indicating whether or not the recorded coded data blocks are simultaneously managed also in the reproduction position management means.

4. A data recording and reproducing apparatus according to claim 1, wherein:

the recording position data managed by the recording position management means further includes data with respect to a start position and an end position of recorded coded data on the data recording medium.

5. A data recording and reproducing apparatus according to claim 1, wherein:

the recording position data managed by the recording position management means further includes data indicating a correspondence between the data selected by the function selection means and the reproduction position data.

6. A data recording and reproducing apparatus according to claim 5, wherein:

the control means, in reproducing recorded coded data in response to a data selection command from the function selection means, uses reproduction position data to reproduce decoded data stored in the buffer memory when data specified by the data selection command exists not at a boundary of coded data blocks but, instead, in the middle of a coded data block.

7. A data recording and reproducing method comprising the steps of:

coding input data supplied to an input terminal and outputting coded data blocks;

recording the coded data blocks on a data recording medium and reproducing the coded data blocks from the data recording medium;

managing and storing recording position data indicating positions at which the coded data blocks are recorded on the data recording medium;

decoding the coded data blocks reproduced from the data recording medium;

temporarily storing the input data in a buffer memory connected to the input terminal and an output terminal before outputting it in predetermined amounts for the coding step and for temporarily storing decoded data output by the decoding step before outputting it to the output terminal;

managing and storing reproduction position management data indicating positions at which the input data is held in the buffer memory and positions at which the decoded data is held in the buffer memory;

selecting a processing to be executed, data which is held in the buffer memory, and coded data blocks recorded on the data recording medium;

managing and storing a correspondence between either or both of the selected data and coded data blocks selected by the selection step, on the one hand, and either or both of the recording position data and the reproduction position data, on the other hand; and in response to the selection step, controlling the coding step, the recording and reproducing step, the recording position management step, the decoding step, the buffer memory, the reproduction position management step, and the recording data management step.

8. A data recording and reproducing method according to claim 7, wherein:

the recording position data managed by the recording position management step includes recording addresses on the data recording medium of a coded data block corresponding to a first input data block in each of a series of recorded coded data blocks, data indicating an amount of recorded data in the series of recorded coded data blocks, and link data indicating a linkage of coded data blocks.

9. A data recording and reproducing method according to claim 8, wherein:

the recording position data managed by the recording position management step further includes data indicating whether or not the recorded coded data blocks are simultaneously managed also in the reproduction position management step.

10. A data recording and reproducing method according to claim 7, wherein:

the recording position data managed by the recording position management step further includes data with respect to a start position and an end position of recorded coded data on the data recording medium.

11. A data recording and reproducing method according to claim 7, wherein:

the recording position data managed by the recording position management step further includes data indicating a correspondence between the data selected by the selection step and the reproduction position data.

12. A data recording and reproducing method according to claim 11, wherein:

the control step, in reproducing recorded coded data in response to a data selection command from the selection step, uses reproduction position data to reproduce decoded data stored in the buffer memory when data specified by the data selection command exists not at a boundary of coded data blocks but, instead, in the middle of a coded data block.

* * * * *